US012638775B2

(12) United States Patent
Chen et al.

(10) Patent No.: US 12,638,775 B2
(45) Date of Patent: May 26, 2026

(54) METHODS AND COMPOSITIONS FOR IMPROVED PATTERNING OF PHOTORESIST

(71) Applicant: Taiwan Semiconductor Manufacturing Co., Ltd., Hsinchu (TW)

(72) Inventors: Ya-Lun Chen, Hsinchu (TW); Ching-Yu Chang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 311 days.

(21) Appl. No.: 17/745,564

(22) Filed: May 16, 2022

(65) Prior Publication Data

US 2023/0146910 A1 May 11, 2023

Related U.S. Application Data

(60) Provisional application No. 63/278,439, filed on Nov. 11, 2021.

(51) Int. Cl.

*G03F 7/38* (2006.01)
*G03F 7/039* (2006.01)
*G03F 7/20* (2006.01)

(52) U.S. Cl.

CPC ................ *G03F 7/38* (2013.01); *G03F 7/039* (2013.01); *G03F 7/20* (2013.01)

(58) Field of Classification Search

CPC .......... G03F 7/38; G03F 7/039; G03F 7/2022; G03F 7/091; G03F 7/094; G03F 7/11; H01L 21/0337

See application file for complete search history.

(56) References Cited

U.S. PATENT DOCUMENTS

2003/0148212 A1 8/2003 Lee et al.
2004/0086809 A1* 5/2004 Goodner .................. G03F 7/09 430/327

(Continued)

FOREIGN PATENT DOCUMENTS

JP H07106234 A 4/1995
KR 1019990030227 A 4/1999

(Continued)

OTHER PUBLICATIONS https://www.appliedmaterials.com/eu/en/semiconductor/markets-and-inflections/memory/dram.html) (Year: 2025).*

(Continued)

*Primary Examiner* — Jonathan Johnson
*Assistant Examiner* — Alexander N. Lee
(74) *Attorney, Agent, or Firm* — Seed IP Law Group

(57) ABSTRACT

Disclosed methods employ acid generator components in an underlayer. Acid generated by the acid generator components diffuses into an overlying layer, e.g., a photoresist layer, and provides acid which chemically alters the photoresist, e.g., alters the solubility of the photoresist in a developer solution. The acid that diffuses into the overlying photoresist layer increases the concentration and the uniformity of concentration of the acid in lower portions of the photoresist. The regions of increased acid concentration within the photoresist can increase the photoresists solubility in developer solutions, thereby reducing inadequate development of the photoresist. Reducing inadequate development of the photoresist can reduce the amount of photoresist residue or scum that remains after development is complete.

20 Claims, 7 Drawing Sheets

(56) References Cited

U.S. PATENT DOCUMENTS

| | | | | |
|---|---|---|---|---|
| 2007/0185298 | A1* | 8/2007 | Baikerikar | H01L 21/02216 528/31 |
| 2008/0206667 | A1* | 8/2008 | De | G03F 7/11 430/323 |
| 2012/0122029 | A1* | 5/2012 | Kudo | G03F 7/091 430/325 |
| 2012/0181251 | A1* | 7/2012 | Minegishi | G03F 7/11 216/49 |
| 2014/0273457 | A1 | 9/2014 | Su et al. | |
| 2014/0363955 | A1* | 12/2014 | Hatakeyama | H01L 21/265 438/514 |
| 2015/0241782 | A1* | 8/2015 | Scheer | H01L 21/0271 430/325 |
| 2016/0216609 | A1 | 7/2016 | Shiobara | |
| 2020/0041905 | A1* | 2/2020 | Tamura | G03F 7/11 |
| 2020/0066536 | A1* | 2/2020 | Yaegashi | H01L 21/0274 |
| 2021/0041785 | A1 | 2/2021 | Dai et al. | |
| 2023/0185196 | A1* | 6/2023 | Weidman | G03F 7/167 355/27 |

FOREIGN PATENT DOCUMENTS

| | | | |
|---|---|---|---|
| KR | 100243709 | B1 | 2/2000 |
| KR | 20180036552 | A | 4/2018 |
| KR | 1020190111119 | A | 10/2019 |
| TW | 200925776 | A | 6/2009 |
| TW | I582829 | B | 5/2017 |

OTHER PUBLICATIONS https://www.nikon.com/business/semi/technology/story02.html (Year: 2025).*

Li, Xin & Rutenbar, Rob & Blanton, R.D .. (2009). Virtual probe: A statistically optimal framework for minimum-cost silicon characterization of nanoscale integrated circuits. IEEE/ACM International Conference on Computer-Aided Design, Digest of Technical Papers, ICCAD. 433-440. 10.1145/1687399.1687481. (Year: 2009).*

Atta-Obeng, Emmanuel. "Characterization of Phenol Formaldehyde Adhesive and Adhesive-Wood Particle Composites Reinforced with Microcrystalline Cellulose". Auburn University. 2011. (Year: 2011).*

* cited by examiner

METHODS AND COMPOSITIONS FOR IMPROVED PATTERNING OF PHOTORESIST

PRIORITY CLAIM AND CROSS-REFERENCE

This application claims the benefit of U.S. Provisional Patent Application No. 63/278,439 filed Nov. 11, 2021, which is incorporated by reference herein in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

In one exemplary aspect, photolithography is a process used in semiconductor micro-fabrication to selectively remove parts of a thin film or a substrate. The process uses light energy to transfer a pattern (e.g., a geometric pattern) from a photomask to a light-sensitive layer (e.g., a photoresist layer) on the substrate. The light causes a chemical change (e.g., increasing or decreasing solubility) in exposed regions of the light-sensitive layer. Baking processes may be performed before and/or after exposing the light sensitive layer, such as in a pre-exposure and/or a post-exposure baking process. A developing process then selectively removes the exposed or unexposed regions of the exposed light sensitive layer with a developer solution forming an exposure pattern in the light sensitive layer. This exposure pattern may be used to form a pattern in thin films or a substrate under the patterned light sensitive layer. Finally, a process is implemented to remove (or strip) the remaining light sensitive layer from the underlying material layer(s), which may be subjected to additional circuit fabrication steps. For a complex IC device, a substrate may undergo multiple photolithographic patterning processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
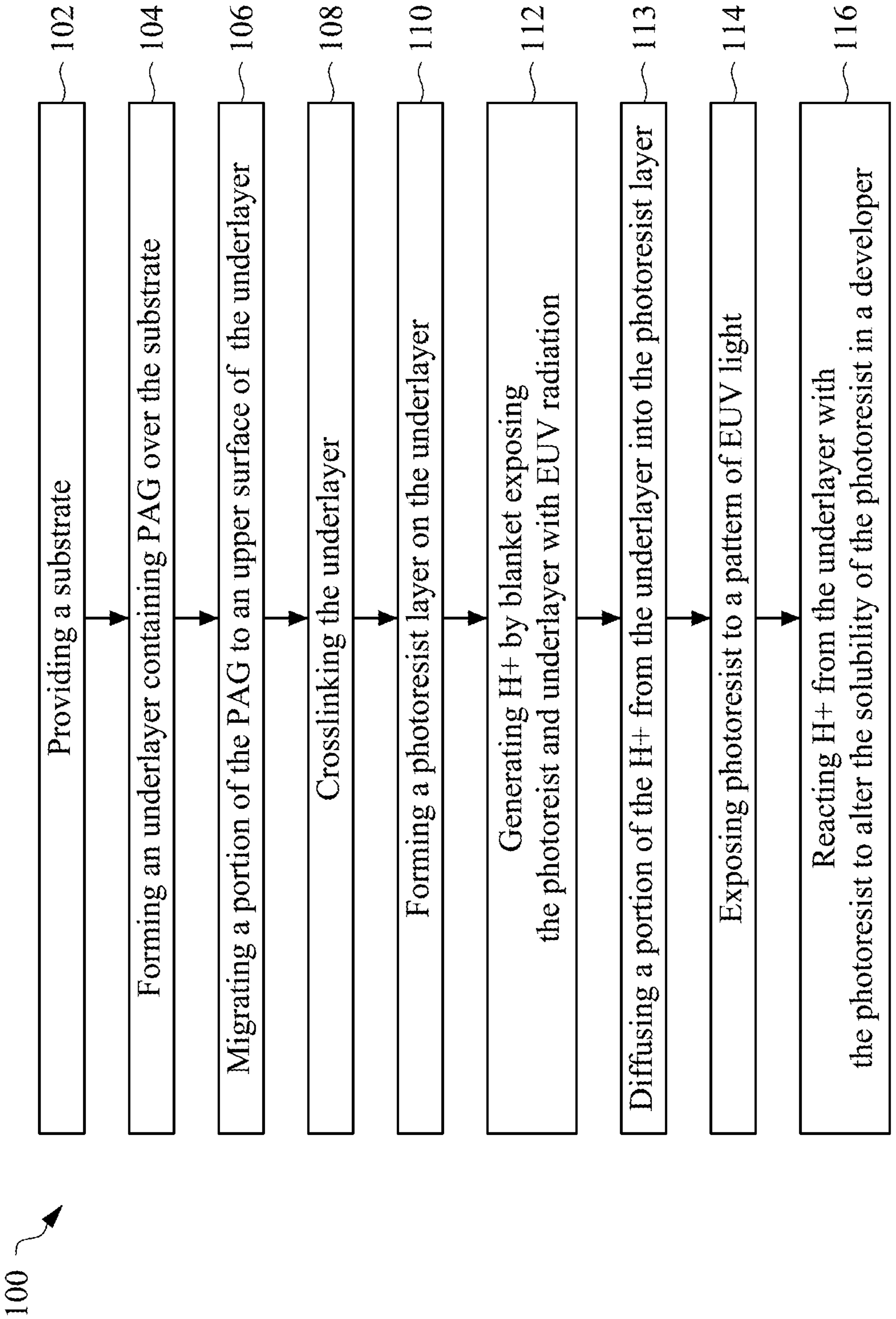
FIGS. 1A and 1B are flow charts of methods in accordance with embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Terms indicative of relative degree, such as “about,” “substantially,” and the like, should be interpreted as one having ordinary skill in the art would in view of current technological norms. Generally, the term “substantially” indicates a tighter tolerance than the term “about.” For example, a thickness of “about 100 units” will include a larger range of values, e.g., 70 units to 130 units (+/−30%), than a thickness of “substantially 100 units,” which will include a smaller range of values, e.g., 95 units to 105 units (+/−5%). Again, such tolerances (+/−30%, +/−5%, and the like) may be process- and/or equipment-dependent, and should not be interpreted as more or less limiting than a person having ordinary skill in the art would recognize as normal for the technology under discussion, other than that “about” as a relative term is not as stringent as “substantially” when used in a similar context.

The present disclosure is generally related to semiconductor devices, and more particularly to field-effect transistors (FETs), such as planar FETs, three-dimensional fin-line FETs (FinFETs), or nano-structure devices, including nanosheet, nano-wire and gate-all-around (GAA) devices. The nano-structure devices, such as gate-all-around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process.

The present disclosure relates generally to IC device manufacturing and, more particularly, to device patterning processes using a multi-layer (e.g., a bi or tri-layer) structure. The bi-layer structure may include a photoresist layer and a bottom layer (e.g., bottom anti-reflective coating, or BARC or other layer, such as a spin on carbon SoC layer) on a conductive layer, e.g., a metal layer or non-conductive layer, e.g., a dielectric layer or substrate. Such bottom layer may also be referred to as an underlayer herein. The tri-layer structure may include a photoresist layer, a middle layer (e.g., a hard mask layer or other spin on carbon layer), and a bottom layer (e.g., bottom anti-reflective coating, or BARC) formed on a conductive layer, e.g., a metal layer or non-conductive layer, e.g., a dielectric layer or substrate. Such bi-layer and tri-layer structures have demonstrated advantages in minimizing substrate reflectivity of a light (e.g., radiation) source and increasing etching selectivity between the bottom layer and the hard mask layer. However, improvements in such structures for advanced patterning processes, e.g., EUV lithography processes, are still desired. For example, it has been observed that features, e.g., patterns formed in the photoresist layer under the increasingly stringent optimized exposure doses (EOP) requirements and/or reducing pitch dimensions, suffer from incomplete development of the photoresist, especially near the interface between the photoresist layer and the underlying bottom or middle layer. Such incomplete development results in photoresist residue remaining in places where it is undesirable and can result in unwanted variations in line width roughness (LWR) and local critical dimension uniformity (LCDU). Such unwanted variations in LWR or LCDU can result in an unwanted reduction in production yield. In accordance with embodiments described herein, methods are provided that modify the photoresist layer in ways that serve to mitigate or remedy the incomplete development of the photoresist, thus improving the quality of the patterns transferred to the photoresist during a lithography patterning process.

Embodiments in accordance with the present disclosure are applicable to semiconductor structures that are manufactured by processes that employ a photoresist material over an underlayer of organic material, e.g., a layer of spin coated organic material, e.g., a backside anti-reflective coating (i.e., BARC) or hard mask material that is over an underlying layer, e.g., a layer or layers of conductive or semi-conductive material (e.g., metal materials) or non-conductive material (e.g., dielectric materials). In accordance with some embodiments of the present disclosure, the underlayer includes acid generators, such as photo acid generators or thermal acid generators and the photoresist includes an amount of the photo acid generator or thermal acid generator that is less than the amount of photo acid generator or thermal acid generator present in the underlayer. In some embodiments of the present disclosure, the acid generator of the underlayer generates a greater amount of acid compared to the amount of acid produced by acid generators of the photoresist. Processes in accordance with embodiments of the present disclosure include steps of generating acid from the photo acid generator or thermal acid generator in the underlayer and diffusing a portion of the formed acid from the underlayer into the overlying photoresist layer. Processes in accordance with embodiments of the present disclosure produce patterned photoresist layers with reduced amounts of residual photoresist or photoresist come present in trenches formed in the photoresist.

In the embodiment in which the bottom layer is a BARC layer, the bottom layer 204 in FIG. 2 comprises a polymer resin containing one or more of the polymers described below, a cross-linking agent, and optionally, a catalyst. These elements of a BARC bottom layer 204, prior to dispersal, are placed within a BARC solvent, which allows for an easier dispersal. Once dispersed within the solvent, bottom layer 204, e.g., a BARC layer, may be baked and/or irradiated with electromagnetic radiate, e.g., light energy, as described below in more detail.

Polymers of the bottom layer 204 include novolac type polymers, polyhydroxystyrene polymers, such as poly(4-hydroxystyrene), novolac/hydroxystyrene copolymers and blends of novolac polymers and polyhydroxystyrene polymers. Novolac type polymers are phenol formaldehyde polymers (PF) or phenolic polymers that are synthetic polymers obtained by the reaction of phenol or substituted phenol with formaldehyde. Novolac polymers have the general structure, where n is one or more:

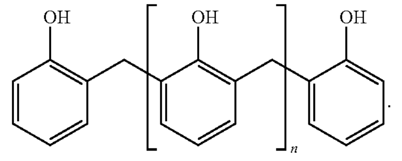

Poly(4-hydroxystyrene) polymers have the general formula, where n is one or more:

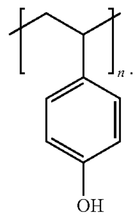

Molecular weight of these types of polymers when used as a BARC are greater than about 3000 and can be greater than about 10,000.

In an embodiment, the polymer of the bottom layer 204, e.g., the BARC, comprises a number of repeating monomer units, such as a surface energy modification monomer unit (with a surface energy modification group or moiety), an optional chromophore monomer unit and a cross-linking monomer unit. The surface energy modification moiety is used to match the surface energy of the bottom layer 204 to the surface energy of the material of the substrate. By matching the surface energies, when necessary, capillary forces may be used to enhance the gap filling performance of the bottom layer 204.

In one embodiment, the surface energy modification moiety may be used to increase the surface energy of the bottom layer 204. In such an embodiment, to raise the surface energy of the bottom layer 204, the surface energy modification monomer unit comprises a moiety that includes one or more of a hydroxyl group, a carboxyl group, an amine group, or an amide group. In a particular embodiment, the surface energy modification unit may have a structure such as the following:

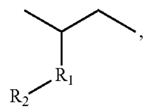

wherein the $R_1$ and $R_2$ groups collectively form a surface energy modification moiety and where $R_1$ is an alkyl group with hydrogen attached to the hydrocarbons and wherein $R_1$ may have a straight, branched, or cyclic structure. The alkyl group within $R_1$ may also comprise hetero atoms, such as containing nitrogen or oxygen atoms. $R_2$ may contain at least one of a hydroxyl, carboxyl, amine, or amide group.

In particular embodiments, the surface energy modification monomer unit may comprise an acrylic acid monomer, a methacrylic acid monomer, a hydrostyrene monomer, or a monomer derived from 2-hydroxyethyl acrylate, some of which have characteristics which allow them to act as the surface energy modification monomer, the chromophore monomer, and the cross-linking monomer. For example, in an embodiment in which the surface energy modification monomer unit is a hydrostyrene monomer, the surface energy modification monomer may have the following structure:

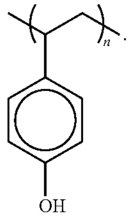

In an embodiment in which the surface energy modification monomer is an acrylic acid monomer, the surface energy modification monomer may have the following structure:

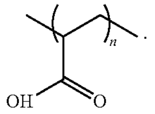

In an embodiment in which the surface energy modification monomer is a monomer derived from 2-hydroxyethyl acrylate, the surface energy modification monomer may have the following structure:

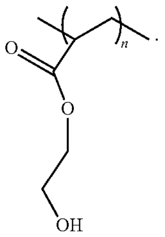

However, as one of ordinary skill in the art will recognize, the precise structures and examples described to raise the surface energy of the bottom layer 204 are intended to be illustrative and are not intended to be limiting. Rather, any suitable functional group within any suitable monomer that would raise the surface energy of the bottom layer 204 may alternatively be utilized. These are all fully intended to be included within the scope of the embodiments described herein.

Alternatively, the surface energy modification monomer may be used to decrease the surface energy of the bottom layer 204. In such an embodiment, to decrease the surface energy of the material of the bottom layer 204, the surface energy modification moiety within the surface energy modification monomer comprises one or more of an alkyl group, a fluoro group, or a benzyl group. In particular embodiments, the surface energy modification group moiety may comprise a linear, branched, or cyclic alkyl or fluoro functional group.

In a particular embodiment, the surface energy modification monomer may have a structure such as the following:

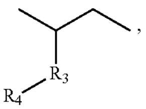

wherein the $R_3$ and $R_4$ groups collectively form the surface energy modification moiety and where $R_3$ is an alkyl group with hydrogen attached to the hydrocarbons and wherein $R_3$ may have a straight, branched, or cyclic structure. The alkyl group within $R_3$ may also comprise hetero atoms, such as containing nitrogen or oxygen atoms. However, in this embodiment, $R_4$ may contain at least one of an alkyl, fluoro, or benzyl group, and may comprise a linear, branched, or cyclic alkyl or fluoro group. For example, in some embodiments, the polymer with the surface energy modification monomer may have the following structures:

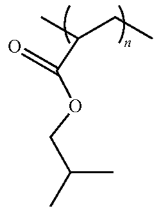
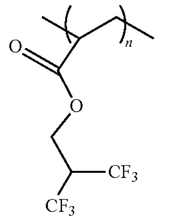
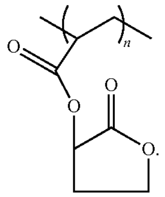

By utilizing the surface energy modification monomer, the surface energy of the polymer and, as such, the material of the bottom layer 204, may be modified such that it more closely resembles the surface energy of the substrate 202. By adjusting the surface energy, the bottom layer material, instead of being repelled by the underlying material, will be drawn into small openings between structures by capillary forces. This helps the bottom layer fill such gaps without voids. For example, in an embodiment, the surface energy of the polymer may be brought to within about 20 dyne/$m^2$ of the surface energy of the underlying material of the substrate 202.

In an embodiment, the chromophore monomer may comprise chromophore moieties such as vinyl compounds containing substituted and unsubstituted phenyl, substituted and unsubstituted anthracyl, substituted and unsubstituted phenanthryl, substituted and unsubstituted naphthyl, substituted and unsubstituted heterocyclic rings containing heteroatoms such as oxygen, nitrogen, sulfur, or combinations thereof, such as pyrrolidinyl, pyranyl, piperidinyl, acridinyl, quinolinyl. The substituents in these units may be any hydrocarbyl group and may further contain heteroatoms, such as, oxygen, nitrogen, sulfur, or combinations thereof, such as alkylenes, ester, ethers, combinations of these, or the like, with a number of carbon atoms between 1 and 12.

In specific embodiments, the chromophore moiety includes styrene, benzene groups, napthalene groups, anthracene groups, phenanthrene groups, hydroxystyrene, acetoxystyrene, vinyl benzoate, vinyl 4-tert-butylbenzoate, ethylene glycol phenyl ether acrylate, phenoxypropyl acrylate, N-methyl maleimide, 2-(4-benzoyl-3-hydroxyphenoxy)ethyl acrylate, 2-hydroxy-3-phenoxypropyl acrylate, phenyl methacrylate, benzyl methacrylate, 9-anthracenylmethyl methacrylate, 9-vinylanthracene, 2-vinylnaphthalene, N-vinylphthalimide, N-(3-hydroxy)phenyl methacrylamide, N-(3-hydroxy-4-hydroxycarbonylphenylazo)phenyl methacrylamide, N-(3-hydroxyl-4-ethoxycarbonylphenylazo) phenyl methacrylamide, N-(2,4-dinitrophenylamino phenyl) maleimide, 3-(4-acetoaminophenyl)azo-4-hydroxystyrene, 3-(4-ethoxycarbonylphenyl)azo-acetoacetoxy ethyl methacrylate, 3-(4-hydroxyphenyl)azo-acetoacetoxy ethyl methacrylate, tetrahydroammonium sulfate salt of 3-(4-sulfophenyl)azoacetoacetoxy ethyl methacrylate, combinations of these, or the like. However, any suitable monomer with chromophore moiety to absorb the impinging light and prevent the light from being reflected may alternatively be used, and all such monomers are fully intended to be included within the scope of the embodiments described herein.

In an embodiment in which the chromophore moiety comprise benzene, the chromophore groups may have the following structure:

In an embodiment in which the chromophore moieties comprise anthracene, the chromophore groups may have the following structure:

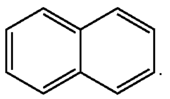

In an embodiment in which the chromophore moieties comprise phenanthrene, the chromophore moieties may have the following structure:

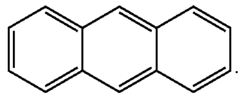 [SMILES: c1ccc2cc3ccccc3cc2c1]

The cross-linking monomer may be used to crosslink the monomer with the polymers to modify the solubility of the bottom layer 204, and may optionally have an acid labile group. In some embodiments, the polymer of bottom layer 204 includes about 1-20 cross-linking moieties, and in other embodiments, the polymer of bottom layer 204 includes about 1-10 cross-linking moieties. In a particular embodiment, the cross-linking monomer may comprise a hydrocarbon chain that also comprises, e.g., a cross-linking moiety, such as a hydroxyl group, a carboxyl acid group, a carboxylic ester group, epoxy groups, urethane groups, amide groups, glycidyl ether groups, alkyl oxide groups, alkene groups, alkyne groups, triazene groups, combinations of these, and the like. Specific examples of cross-linking monomers that may be utilized include polyhydroxystyrene, poly (hydroxynaphthalene), poly(meth)acrylates, polyarylates, polyesters, polyurethanes, alkyd resins (aliphatic polyesters), poly(hydroxystyrene-methylmethacrylate), homopolymers and/or copolymers obtained by polymerization of at least one of the following monomers: styrene, hydroxystyrene, hydroxyethyl(meth)acrylate, hydroxypropyl(meth) acrylate, methyl (meth)acrylate, ethyl (meth)acrylate, (meth)acrylic acid, poly(hydroxystyrene-styrene-methacrylate), poly(hydroxystyrene-styrene-methacrylate), poly(4-hydroxystyrene), and poly(pyromellitic dianhydride-ethylene glycol-propylene oxide).

In a particular embodiment, the cross-linking monomer may have the following structure:

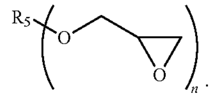

where $R_5$ comprises an alkyl group with hydrogen attached to the hydrocarbon structure, wherein the alkyl group may have a straight, branched, or cyclic structure. Additionally, the alkyl group may also comprise a hetero atom, such as comprising a nitrogen atom or an oxygen or fluorine atom, or even an alkyl fluoride.

In alternative embodiments, the cross-linking monomer may have the following structures:

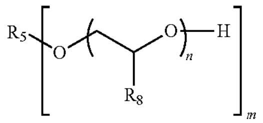

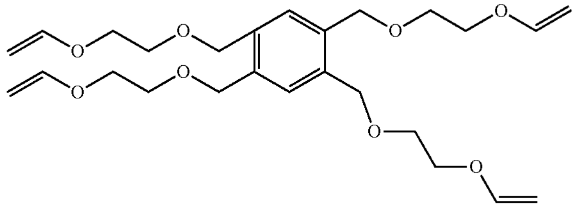

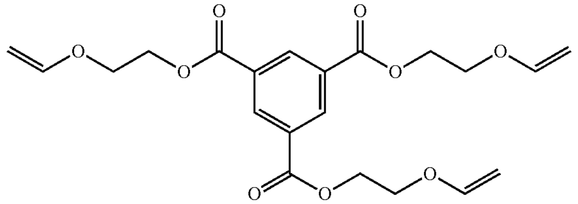

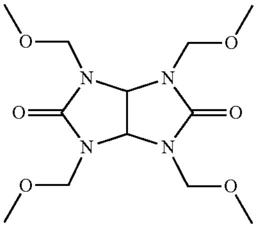

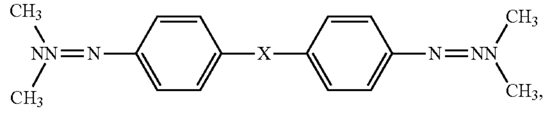

where $R_5$ is the same as above and wherein $R_6$ represents a hydrogen atom or an alkyl group having 1 to 10 carbon atoms, and where n represents an integer number from 2 to 6, and where X is an optional cross-linking unit or spacer, with between 2 and 8 carbons atoms, such as an alkane unit.

In some embodiments, the cross-linking monomer has a cross-linking moiety that crosslinks when exposed to thermal energy. Such types of cross-linking moieties that cross-link when exposed to thermal energy include functional groups selected from —OH, —OR, —ROH, —$R(OH)_2$, —$NR_2$, —NRH, —C═CH, —C≡CH, —COOH, —RCOOH, —SH and —RSH, where R is where R=–$C_nH_{2n}$, —O—$C_nH_{2n}$–; X=epoxy, —OR, —$NH_2$, —$NR_aH$, where $R_a$ is —$C_nH_{2n+1}$ and n=1-4. In some embodiments, the cross-linking monomer is a cross-linking moiety that cross-links when exposed to light energy, i.e., a cross-linking moiety that is photosensitive. Examples of cross-linking moieties that are photosensitive include dienes (—C═CH—CH═C), —C═CH, —C≡CH or —N═N═N. Additionally, as one of ordinary skill in the art will recognize, the above description for the various monomers that may be polymerized to form the polymer for the bottom layer 204 are intended to be illustrative and are not intended to limit the embodiments in any fashion. Rather, any suitable monomer or combination of monomers that perform the desired functions of the monomers described herein may also be utilized. All such monomers are fully intended to be included within the scope of the embodiments described herein.

In an embodiment, the surface energy modification monomer may have a loading within the polymer of between about 1% and about 100%, such as about 90%. Also, the chromophore monomer may have a loading within the polymer of between about 0% and about 100% (such as when the surface energy modification monomer can also act as the chromophore monomer), such as about 5%, and the cross-linking monomer may have a loading of between about 0% and about 100% (such as when the surface energy modification monomer can also act as the cross-linking monomer), such as about 5%. However, these descriptions are intended to be illustrative, as any suitable loading between the various monomers of the polymer may be used, and all such loadings are fully intended to be included within the scope of the embodiments described herein.

The catalyst may be a compound that is used to generate a chemically active species and initiate a cross-linking reaction between the polymers of the polymer resin and may be, e.g., a thermal acid generator, a photo acid generator, or a photobase generator, suitable combinations of these, or the like. In an embodiment in which the catalyst is a thermal acid generator, the catalyst will generate an acid when sufficient heat is applied to the bottom layer 204. Specific examples of the thermal acid generator include butane sulfonic acid, triflic acid, nanoflurobutane sulfonic acid, nitrobenzyl tosylates, such as 2-nitrobenzyl tosylate, 2,4-dinitrobenzyl tosylate, 2,6-dinitrobenzyl tosylate, 4-nitrobenzyl tosylate; benzenesulfonates such as 2-trifluoromethyl-6-nitrobenzyl 4-chlorobenzenesulfonate, 2-trifluoromethyl-6-nitrobenzyl 4-nitro benzenesulfonate; phenolic sulfonate esters such as phenyl, 4-methoxybenzenesulfonate; alkyl ammonium salts of organic acids, such as triethylammonium salt of 10-camphorsulfonic acid, combinations of these, or the like.

In an embodiment in which the catalyst is a photo acid generator, the catalyst may comprise halogenated triazines, onium salts, diazonium salts, aromatic diazonium salts, phosphonium salts, sulfonium salts, iodonium salts, imide sulfonate, oxime sulfonate, diazodisulfone, disulfone, o-nitrobenzylsulfonate, sulfonated esters, halogenerated sulfonyloxy dicarboximides, diazodisulfones, α-cyanooxyamine-sulfonates, imidesulfonates, ketodiazosulfones, sulfonyldiazoesters, 1,2-di(arylsulfonyl)hydrazines, nitrobenzyl esters, and the s-triazine derivatives, suitable combinations of these, and the like.

Specific examples of photo acid generators that may be used include α-(trifluoromethylsulfonyloxy)-bicyclo[2.2.1]hept-5-ene-2,3-dicarboximide (MDT), N-hydroxy-naphthalimide (DDSN), benzoin tosylate, t-butylphenyl-α-(p-toluenesulfonyloxy)-acetate and t-butyl-α-(p-toluenesulfonyloxy)-acetate, triarylsulfonium and diaryliodonium hexafluoroantimonates, hexafluoroarsenates, trifluoromethanesulfonates, iodonium perfluorooctanesulfonate, N-camphorsulfonyloxynaphthalimide, N-pentafluorophenylsulfonyloxynaphthalimide, ionic iodonium sulfonates such as diaryl iodonium (alkyl or aryl) sulfonate and bis-(di-t-butylphenyl)iodonium camphanylsulfonate, perfluoroalkanesulfonates such as perfluoropentanesulfonate, perfluorooctanesulfonate, perfluoromethanesulfonate, aryl (e.g., phenyl or benzyl) triflates such as triphenylsulfonium triflate or bis-(t-butylphenyl)iodonium triflate; pyrogallol derivatives (e.g., trimesylate of pyrogallol), trifluoromethanesulfonate esters of hydroxyimides, α,α'-bis-sulfonyl-diazomethanes, sulfonate esters of nitro-substituted benzyl alcohols, naphthoquinone-4-diazides, alkyl disulfones, and the like.

In other embodiments the catalyst may be a photobase generator. In such an embodiment, the photobase generator may comprise quaternary ammonium dithiocarbamates, aminoketones, oxime-urethane containing molecules such as dibenzophenoneoxime hexamethylene diurethan, ammonium tetraorganylborate salts, and N-(2-nitrobenzyloxycarbonyl) cyclic amines, suitable combinations of these, or the like.

In specific embodiments the catalyst may utilize an amine, which will quench the acidity of, e.g., an acid functional group. As such, the acid will be generated by a removal of the amine, such as by evaporation of the amine during, e.g., a baking process. In this embodiment the catalyst may have the following structures:

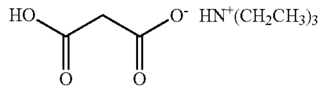

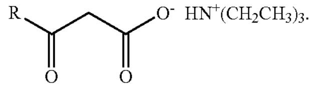

In addition to the polymer resin and optional catalyst described above, bottom layer 204 also includes a cross-linking agent. As described below in more detail, the base cross-linking agents react with the polymers of the polymer resin of the bottom layer 204 to crosslink the polymers of the polymer resin. Such cross-linking occurs in response to exposure of the polymers of the polymer resin and the cross-linking agent to sufficient thermal energy to promote cross-linking of the polymers of the polymer resins with the cross-linking agents described herein. This cross-linking assists in increasing the cross-linking density of the material of the bottom layer. Suitable cross-linking agents for cross-linking the polymers of the polymer resins in response to thermal energy include cross-linking moieties such as epoxy groups (ROR), ester (R—COOR) groups, ether (R—OR), tosylate groups (R—OT), —C═CH, —C≡C, SH, or anhydride where (R can be alkyl with 1 to 10 carbon atoms, benzyl, diene, allyl, phenyl or heterocyclic). In addition, cross-linking of the polymers of the polymer resin with cross-linking agents can be achieved by cross-linking the polymer of the polymer resin with photosensitive cross-linking agents that react with the polymer in response to exposure to light energy. Suitable photosensitive cross-linking agents may include one or more photosensitive cross-linking moieties such as —CH═CH2, —CH═CH—CH═CH2, acrylate (—CO—CH═CH2), cyclic alkylidene and the like. This cross-linking assists in increasing the cross-linking density of the material of the bottom layer. In addition, the photosensitive cross-linking agents may also crosslink with each other to further increase the density of the material of the bottom layer 204. In some embodiments, suitable cross-linking agents include moieties from each of the types of moieties described in the immediately preceding two sentences.

In an embodiment, the cross-linking agent may be a melamine based agent, a urea based agent, ethylene urea based agent, propylene urea based agent, glycoluril based agent, an aliphatic cyclic hydrocarbon having a hydroxyl group, a hydroxyalkyl group, or a combination of these, oxygen containing derivatives of the aliphatic cyclic hydrocarbon, glycoluril compounds, etherified amino resins, a polyether polyol, a polyglycidyl ether, a vinyl ether, a triazine, an alkene, and alkyne, combinations of these, or the like.

Specific examples of materials that may be utilized as a cross-linking agent include melamine, acetoguanamine, benzoguanamine, urea, ethylene urea, or glycoluril with formaldehyde, glycoluril with a combination of formaldehyde and a lower alcohol, hexamethoxymethylmelamine, bismethoxymethylurea, bismethoxymethylbismethoxyethylene urea, tetramethoxymethylglycoluril, and tetrabutoxymethylglycoluril, mono-, di-, tri-, or tetra-hydroxymethylated glycoluril, mono-, di-, tri-, and/or tetra-methoxymethylated glycoluril, mono-, di-, tri-, and/or tetra-ethoxymethylated glycoluril, mono-, di-, tri-, and/or tetra-propoxymethylated glycoluril, and mono-, di-, tri-, and/or tetra-butoxymethylated glycoluril, 2,3-dihydroxy-5-hydroxymethylnorbornane, 2-hydroxy-5,6-bis(hydroxymethyl)norbornane, cyclohexanedimethanol, 3,4,8(or 9)-trihydroxytricyclodecane, 2-methyl-2-adamantanol, 1,4-dioxane-2,3-diol and 1,3,5-trihydroxycyclohexane, tetramethoxymethyl glycoluril, methylpropyltetramethoxymethyl glycoluril, and methylphenyltetramethoxymethylglycoluril, 2,6-bis(hydroxymethyl)p-cresol, N-methoxymethyl- or N-butoxymethyl-melamine. Additionally, compounds may be obtained by reacting formaldehyde, or formaldehyde and lower alcohols with amino group-containing compounds, such as melamine, acetoguanamine, benzoguanamine, urea, ethylene urea and glycoluril, and substituting the hydrogen atoms of the amino group with hydroxymethyl group or lower alkoxymethyl group, examples being hexamethoxymethylmelamine, bismethoxymethyl urea, bismethoxymethylbismethoxyethylene urea, tetramethoxymethyl glycoluril and tetrabutoxymethyl glycoluril, copolymers of 3-chloro-2-hydroxypropyl methacrylate and methacrylic acid, copolymers of 3-chloro-2-hydroxypropyl methacrylate and cyclohexyl methacrylate and methacrylic acid, copolymers of 3-chloro-2-hydroxypropyl methacrylate and benzyl methacrylate and methacrylic acid, bisphenol A-di(3-chloro-2-hydroxypropyl) ether, poly(3-chloro-2-hydroxypropyl)ether of a phenol novolac polymer, pentaerythritol tetra(3-chloro-2-hydroxypropyl)ether, trimethylolmethane tri(3-chloro-2-hydroxypropyl)ether phenol, bisphenol A-di(3-acetoxy-2-hydroxypropyl)ether, poly(3-acetoxy-2-hydroxypropyl)ether of a phenol novolac polymer, pentaerythritol tetra(3-acetoxy-2-hydroxypropyl)ether, pentaerythritol poly(3-chloroacetoxy-2-hydroxypropyl)ether, trimethylolmethane tri(3-acetoxy-2-hydroxypropyl)ether, combinations of these, or the like.

Other specific examples of materials that can be used as cross-linking agents in accordance with embodiments of the present disclosure include acrylate polymers based on acrylate monomers functionalized by R—X (where R═—$C_nH_{2n}$, —O—$C_nH_{2n}$—; X=epoxy, —OR, —$NH_2$, —$NR_aH$ where $R_a$ is —$C_nH_{2n+1}$ and n=1-4); poly(4-hydroxystyrene) polymer based on 4-hydroxystyrene monomers functionalized by R—X (where R═—$C_nH_{2n}$, —O—$C_nH_{2n}$—; X=epoxy, —OR, —$NH_2$, —$NR_aH$ where $R_a$ is —$C_nH_{2n+1}$ and n=1-4), novolac type polymers with 4-hydroxystyrene monomer functionalized by R—X (where R═—$C_nH_{2n}$, —O—$C_nH_{2n}$—, X=epoxy, —OR, —$NH_2$, —$NR_aH$ where $R_a$ is —$C_nH_{2n+1}$ and n=1-4); and copolymers or blends thereof.

Additionally, as one of ordinary skill in the art will recognize, the precise examples listed above regarding the structures and groups of the compounds that may be used within the polymer resin, including the polymers, the cross-linking agents and the catalysts are illustrative and are not intended to list every possible structure or group that may be utilized. Any suitable alternative structures and any suitable alternative groups of the compounds that maybe used within the polymer resin, including the polymers, the cross-linking agents and the catalyst, and all such structures and groups are fully intended to be included within the scope of the embodiments described herein.

For example in accordance with another embodiment, layer 204 includes a material that is not a BARC material. For example, layer 204 can be a spin on coated material, such as a spin on carbon (SoC) hard mask. With the increasing down-scaling of semiconductor devices, multiple lithography patterning processes are adapted to print the features that are smaller than the single exposure lithographic resolution limit. In multiple patterning processes, a spin-on-coating (SOC) layer is often used to smooth topographical features so that a photoresist layer subsequently formed on the SOC layer exhibits less substantial thickness variations. In some embodiments, the spin on coated material includes a precursor polymer that can be cross-linked at an elevated temperature. In some embodiments, the precursor polymer contains cross-linkable functional groups such as —OH, —SH, —$NH_2$, —NH—, —CO—$NH_2$, —CO—NH—, —O—CO—NH—, —NH—CO—NH—, —CO—OH—, —CO—O—, —CO—O—, —CS—OH, —CO—SH, —CS—SH, —CO—O—CO—, —$SO_3H$, —$SO_2$(O—), —$PO_3H_2$, PO(O—)$_2$, —$SO_2$—$NH_2$, —$SO_2$—NH—, —CO—$CH_2$—CO—, —CH═CH—, —CH═$CH_2$, —CO—CH═$CH_2$, —CO—C($CH_3$)═$CH_2$, or epoxy including:

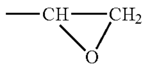 and 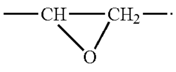.

As discussed above, it has been observed that with increasingly stringent EOP requirements and the ever reducing pitch dimensions, complete development of photoresist, especially near an interface between the photoresist layer and an underlying bottom layer or underlayer, is becoming more challenging. For example, when development of an exposed photoresist is incomplete, photoresist residue, e.g., photoresist scum, can remain in places where it is undesirable and can result in unwanted variations in line width roughness (LWR) and local critical dimension uniformity (LCDU). Such unwanted variations in LWR or LCDU can result in unwanted reduction in production yield. In accordance with embodiments described herein, methods are provided that modify the photoresist layer, prior to or after patterning, in ways that mitigate or remedy the incomplete development of the photoresist, thus improving the quality of the pattern that is transferred to the photoresist during a lithography patterning process.

Without intending to be bound by theory, it is believed that the methods in accordance with embodiments described herein promote the migration or diffusion of acid, e.g., H+ moieties, from the underlayer into an overlying photoresist layer. In accordance with some embodiments of the present disclosure, an amount of acid originating from the underlayer that is present in the photoresist layer exceeds the amount of acid generated from acid generators originally present in the photoresist layer as applied to the underlayer. In accordance with embodiments of the present disclosure, the acid which diffuses into the photoresist layer from the underlayer interacts with the photoresist layer such that the solubility in a developer of portions of the photoresist layer exposed to patterning radiation increases. In accordance with some embodiments, the solubility of the photoresist is more uniform throughout a depth of the photoresist and/or across a lateral dimension of the photoresist layer. This increased solubility of the photoresist in the developer and/or more uniform solubility throughout a depth or lateral dimension of the photoresist reduces the likelihood that unwanted photoresist residue remains in unwanted locations after photoresist development. This reduction in the presence of unwanted photoresist residue will reduce the degree of unwanted variations in LWR and/or LCDU, leading to increased production yields.

FIG. 1A illustrates a flowchart of a method 100 for patterning a workpiece 200 according to some aspects of the present disclosure. The method 100 is merely an example, and is not intended to limit the present disclosure beyond what is explicitly recited in the claims. Additional operations can be provided before, during, and after the method 100, and some operations described can be replaced, eliminated, or completed in a sequence different from that illustrated in FIG. 1A. Intermediate steps of the method 100 are described with reference to cross-sectional views of the workpiece 200 as shown in FIGS. 2-7. For clarity and ease of explanation, some elements of the figures have been simplified.

Figure 1B:
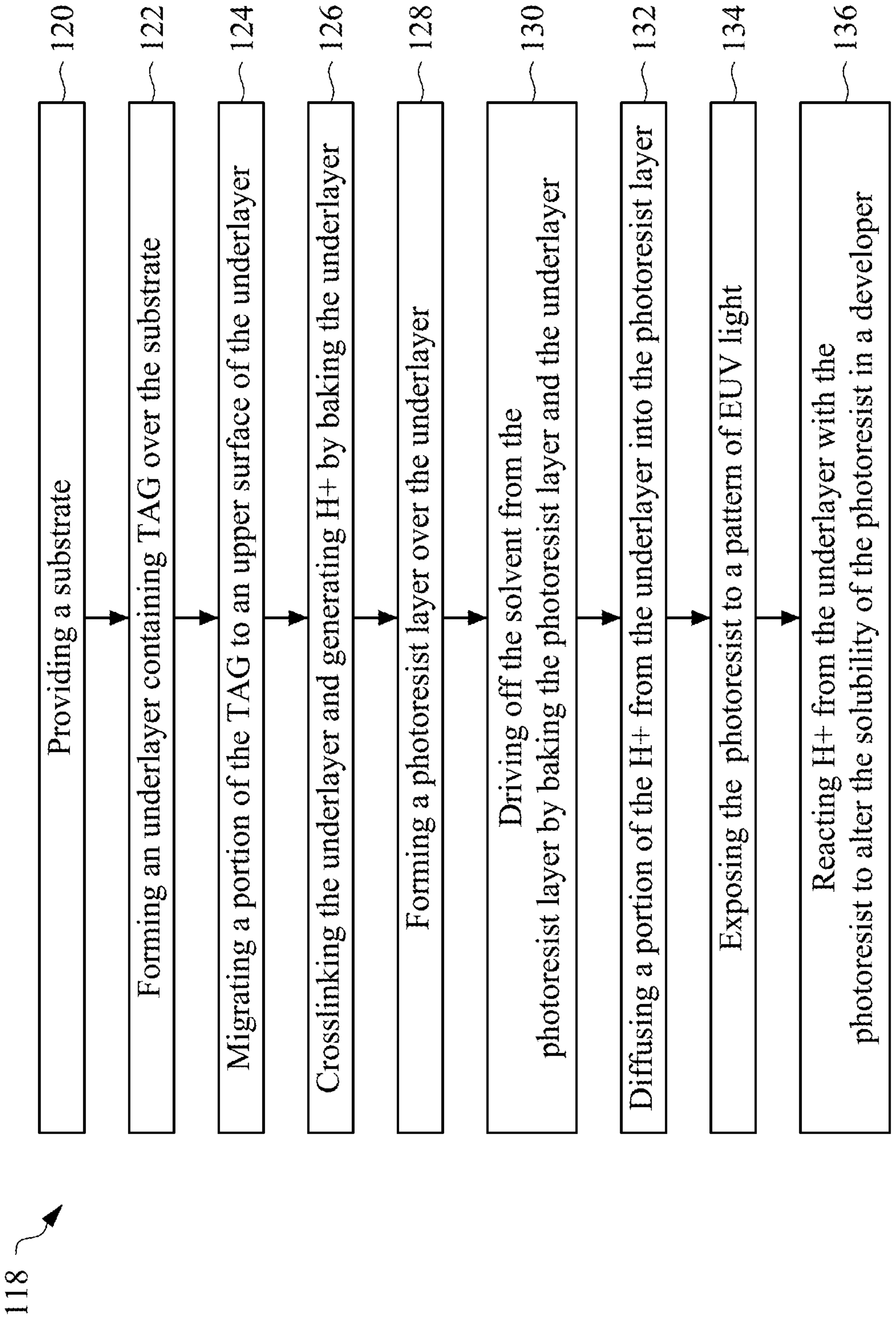
Figure 2:
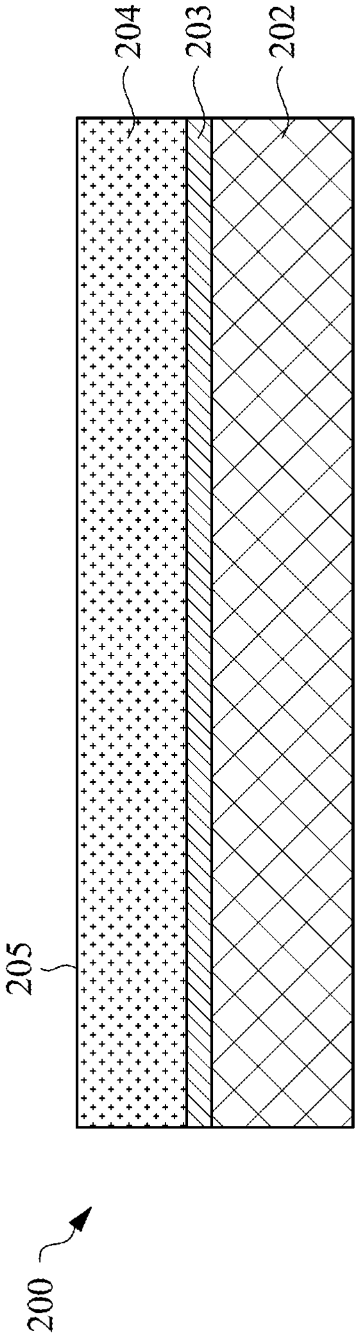
FIGS. 2-7 are views of various embodiments of an IC device at various stages of fabrication according to various aspects of the present disclosure.

Referring to block 102 of FIG. 1A, block 120 of FIG. 1B and to FIG. 2, a workpiece 200 including a substrate 202 is provided (or received) for patterning. The substrate 202 may comprise an elementary (single element) semiconductor, such as silicon and/or germanium; a compound semiconductor, such as silicon carbide, gallium arsenic, gallium phosphide, indium phosphide, indium arsenide, and/or indium antimonide; an alloy semiconductor such as SiGe, GaAsP, AlInAs, AlGaAs, GaInAs, GaInP, and/or GaInAsP; a non-semiconductor material, such as soda-lime glass, fused silica, fused quartz, and/or calcium fluoride ($CaF_2$); and/or combinations thereof.

The substrate 202 may be a single-layer material having a uniform composition; alternatively, the substrate 202 may include multiple material layers having similar or different compositions suitable for IC device manufacturing. In one example, the substrate 202 may be a silicon-on-insulator (SOI) substrate having a semiconductor silicon layer formed on a silicon oxide layer. In other examples such as the one depicted in FIG. 2, the substrate 202 includes a conductive layer or feature 203, e.g., metal layer or feature 203, a semiconductor layer, a dielectric layer, other layers, and/or combinations thereof.

The substrate 202 may include various circuit features formed thereon including, for example, field effect transistors (FETs), metal-oxide semiconductor field effect transistors (MOSFETs), CMOS transistors, high voltage transistors, high frequency transistors, bipolar junction transistors, diodes, resistors, capacitors, inductors, varactors, other suitable devices, and/or combinations thereof.

In some embodiments where the substrate 202 includes FETs, various doped regions, such as source/drain regions, are formed on the substrate 202. The doped regions may be doped with p-type dopants, such as phosphorus or arsenic, and/or n-type dopants, such as boron or $BF_2$, depending on design requirements. The doped regions may be planar or non-planar (e.g., in a nano-structure FET device) and may be formed directly on the substrate 202, in a P-well structure, in an N-well structure, in a dual-well structure, or using a raised structure. Doped regions may be formed by implantation of dopant atoms, in-situ doped epitaxial growth, and/or other suitable techniques.

Figure 8:
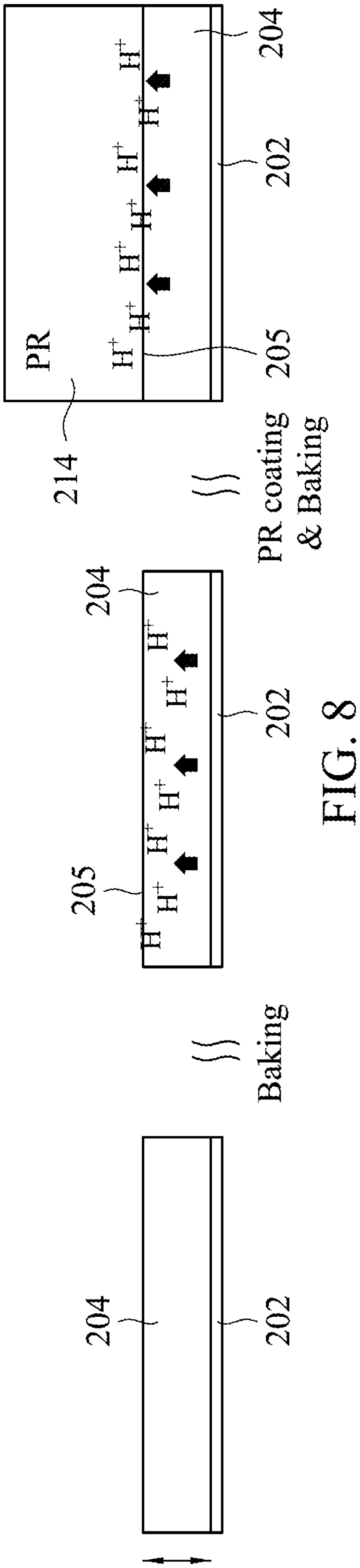
FIGS. 8 and 9 are views of various embodiments of an IC device at various stages of fabrication according to various aspects of the present disclosure.
Figure 9:
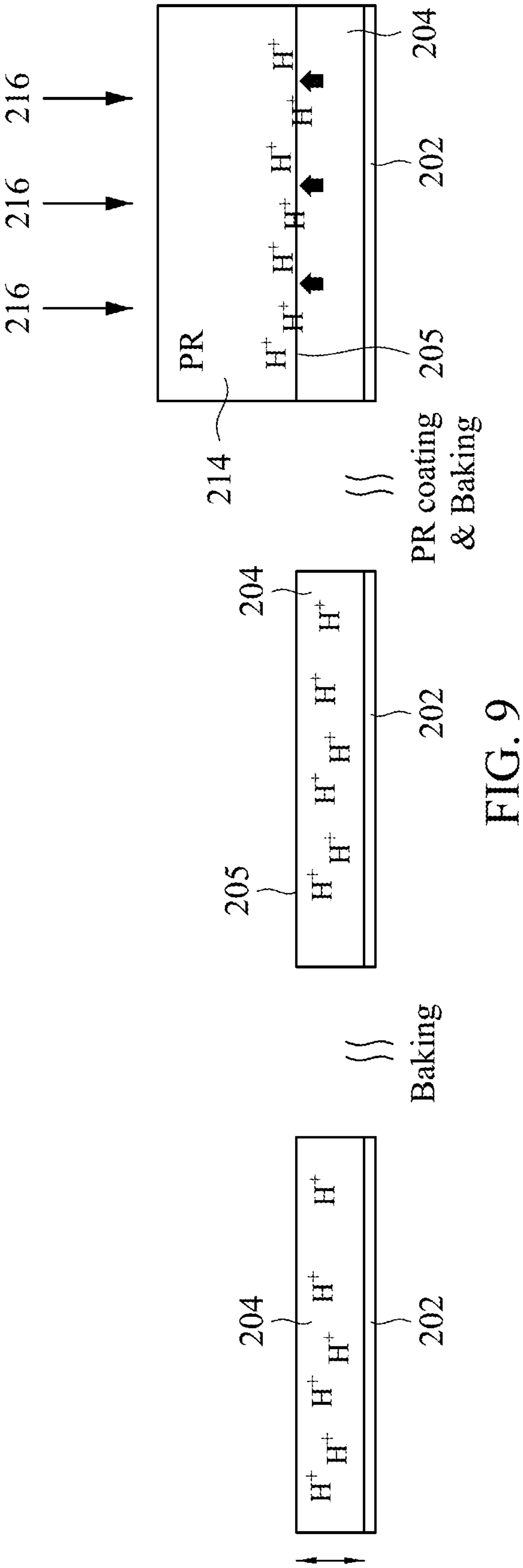

Referring to block 104 of FIG. 1A and; block 122 of FIG. 1B and to FIG. 2, FIG. 8 and FIG. 9, a bottom layer 204 (also referred to as an underlayer herein) is formed on the substrate 202, e.g., over the substrate 202 or over the conductive layer 203 when present in or on substrate 202. In some embodiments, the bottom layer 204 is a spin on coated layer, e.g., a bottom anti-reflective coating (BARC) whose composition is chosen to minimize reflectivity of the light source implemented during exposure of a photoresist layer (e.g., photoresist layer 214 in FIGS. 3, 8 and 9) subsequently formed over the bottom layer 204. The bottom layer 204 may be formed by spin-coating a BARC onto a top surface of the substrate 202 (or a top surface of the topmost material layer of a multi-layer substrate 202) and baking at an elevated temperature or exposing the BARC to light, as described below in more detail. In other embodiments, the bottom layer 204 can be a spin on coated material other than a BARC, e.g., a spin on carbon hard mask material. In accordance with embodiments of the present disclosure, the underlayer that is formed on the substrate has a thickness of less than about 100 angstroms. While embodiments in accordance with the present disclosure include methods that utilize an underlayer that is thicker than about 100 angstroms, the increase in the solubility of the photoresist in a developer is more pronounced when the underlayer is less than 100 Å thick compared to when the underlayer is more than 100 Å thick.

As noted above, the substrate 202 may be a non-semiconductor material. For example, the substrate 202 may be a metal oxide, such as titanium oxide, hafnium oxide, yttrium oxide, lanthanum oxide, strontium titanium oxide, hafnium silicon oxide, hafnium silicon oxynitride, hafnium tantalum oxide, hafnium titanium oxide, hafnium aluminum oxynitride, hafnium zirconium oxide, titanium silicon nitride or aluminum oxide, or a metal nitride, such as titanium nitride, titanium silicon oxynitride, tantalum nitride tungsten nitride, or molybdenum nitride, into which closely spaced features or openings are to be formed in accordance with embodiments described herein. These and all other suitable substrate materials may alternatively be utilized, and all such materials are fully intended to be included within the scope of the described embodiments. The bottom layer 204 is applied over the substrate 202 and may fill the regions between features of the substrate in preparation for an application of a photoresist layer 214 in FIGS. 3, 8 and 9. In an embodiment, the bottom layer 204 is a bottom anti-reflective coating layer which, as its name suggests, works to prevent the uncontrolled and undesired reflection of energy (e.g., light) back into the overlying photoresist layer 214 during an exposure of the photoresist layer 214, thereby preventing the reflecting light from causing reactions in an undesired region of the photoresist layer 214. Additionally, the bottom layer 204 may be used to provide a planar surface over the substrate 202 and features on or in the substrate 202, helping to reduce the negative effects of the energy impinging at an angle on the photoresist layer 214.

However, as one of ordinary skill in the art will recognize, a BARC as a bottom layer 204 is only one illustrative embodiment and is not intended to limit bottom layer 204 to a BARC. Rather, the material of the bottom layer 204 may be used in other capacities, such as for gap-fill, a material to lessen the impacts of a chemical mechanical polish process, an etching process, an implantation process, or even as a photoresist. The material of bottom layer 204 may be used for any suitable purpose and all such purposes are fully intended to be included within the scope of the embodiments.

In accordance with an embodiment of the present disclosure, the bottom layer 204 includes a photo acid generator, such as one or more of the photo acid generators described above. In some embodiments, the photo acid generator is a photo acid generator that includes fluorine. The fluorine of the photo acid generator causes the photo acid generator to have a lower attraction (hydrogen bonding attraction, van der Waals attraction, dipole attraction and the like) to/with other materials in the bottom layer 204 compared to the attraction a photo acid generator without fluorine has for other materials, e.g., the polymer of the bottom layer 204. This reduced attraction allows the fluorine-containing photo acid generator to rise within the bottom layer to a greater degree than the same photo acid generator without fluorine. For example, in this embodiment, the photo acid generator includes any of the photo acid generators described above that include fluorine or which have been modified to replace one or more functional groups with functional groups that causes the photo acid generator to have a lower attraction to other materials in the bottom layer as compared to the attraction to other materials exhibited by the same photo acid generator that does not include fluorine or other low attraction elements. For example, functional groups of a non-fluorine-containing photo acid generator can be replaced with a fluorine-containing functional group. Examples of fluorine-containing functional groups include functional groups which satisfy the following chemical formula, $—(CH_xF_y)_nCH_zF_m$ where n is 1 to 10, x+y=2 and z+m=3. The fluorine-containing functional groups are examples of functional groups which cause the photo acid generator to have a lower attraction to other materials in the bottom layer as compared to the attraction non-fluorine-containing photo acid generators have to other materials in the bottom layer. Other functional groups which exhibit a lower attraction for other materials in the bottom layer similar to the described fluorine-containing functional groups are also within the scope of the present disclosure.

Some specific examples of photo acid generators useful in accordance with embodiments of the present disclosure include photo acid generators that upon exposure to illumination generate acid (H+) accordingly the following general reaction:

FIG. 3

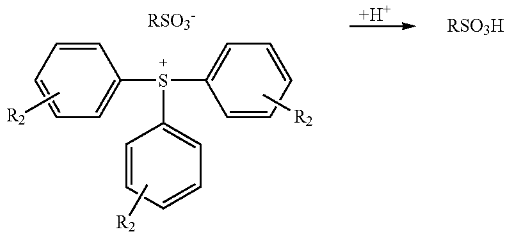

where R is an aromatic carbon ring, or straight or cyclic alkyl/alkoxyl/fluoro chain with 1-6 carbon atoms or straight or cyclic alkene, alkyne, hydroxyl, ketone, aldehyde, carbonate, carboxylic acid, ester, ether, amide, amine, imine, imide, azide, nitrate, nitrile, nitrite or thiol functional group with the 1-6 carbon atoms. R and $R_2$ may further comprise —Cl; —Br; —I; —$NO_2$; —$SO_3^+$; —H—: —CN; —NCO, —OCN; —$CO_2$—; —OH; —OR*, —OC(O)CR*; —SR*, —$SO_2N(R^*)_2$; —$SO_2R^*$; —SOR*; —OC(O)R*; —C(O)OR*; —C(O)R*; —$Si(OR^*)_3$; —$Si(R^*)_3$; epoxyl groups, where R* is H, an unbranched or branched, cyclic or noncyclic saturated or unsaturated alkyl or alkenyl or alkynyl groups.

Specific examples of fluorine-containing photo acid generators useful in embodiments of the present disclosure include triphenylsulfonium perfluoro-1-butanesulfonate having the formula:

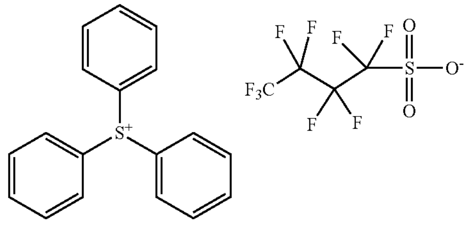 [SMILES: c1ccc([S+](c2ccccc2)c2ccccc2)cc1 ; O=S(=O)([O-])C(F)(F)C(F)(F)C(F)(F)C(F)(F)F]

(4-fluorophenyl)diphenylsulfonium triflate having the formula:

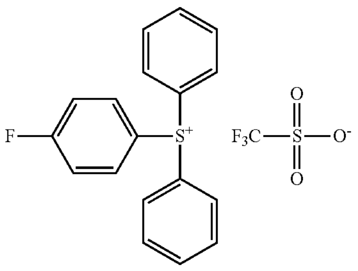 [SMILES: Fc1ccc([S+](c2ccccc2)c2ccccc2)cc1 ; O=S(=O)([O-])C(F)(F)F]

and tris-(4-tert-butylphenyl)sulfonium triflate having the formula:

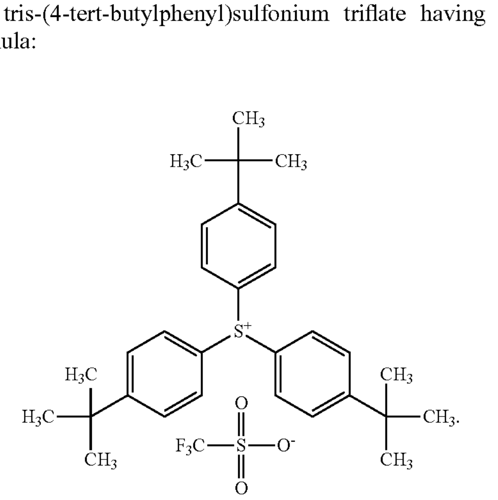

In accordance with other embodiments, the underlayer 204 includes a thermal acid generator. A thermal acid generator is a material that generates acid in response to exposure to thermal energy. In accordance with an embodiment of the present disclosure, the bottom layer 204 includes a thermal acid generator (TAG), such as one or more of the thermal acid generators described above. In some embodiments, the thermal acid generator is a thermal acid generator that includes fluorine. The fluorine of the thermal acid generator causes the thermal acid generator to have a lower attraction (hydrogen bonding attraction, van der Waals attraction, dipole attraction and the like) to/with other materials in the bottom layer 204 compared to the attraction a thermal acid generator without fluorine has for other materials, e.g., the polymer of the bottom layer 204. This reduced attraction allows the fluorine-containing thermal acid generator to rise within the bottom layer to a greater degree than the same thermal acid generator that does not include fluorine. For example, in this embodiment, the thermal acid generator includes any of the thermal acid generators described above that include fluorine or which have been modified to replace one or more functional groups with functional groups that causes the thermal acid generator to have a lower attraction to other materials in the bottom layer as compared to the attraction to other materials exhibited by the same thermal acid generator that does not include fluorine or other low attraction elements. For example, functional groups of a non-fluorine-containing thermal acid generator can be replaced with a fluorine-containing functional group. Examples of fluorine-containing functional groups include functional groups which satisfy the following chemical formula, $—(CH_xF_y)_nCH_zF_m$ where n is 1 to 10, x+y=2 and z+m=3. The fluorine-containing functional groups are examples of functional groups which cause the thermal acid generator to have a lower attraction to other materials in the bottom layer as compared to the attraction the same thermal acid generator without fluorine has to other materials in the bottom layer. Other functional groups which exhibit a lower attraction for other materials in the bottom layer similar to the described fluorine-containing functional groups are also within the scope of the present disclosure.

Some specific examples of thermal acid generators useful in accordance with embodiments of the present disclosure include thermal acid generators that upon exposure to thermal energy (e.g., baking at 90° C. to 400° C.) generate acid (H+). Examples of suitable thermal acid generators include fluorine-containing thermal acid generators have a general formula of $CF_3—R—CF_2SO_3^{+}(R^1)_4N^+$, wherein R is straight or cyclic alkyl/alkoxyl/fluoro/iodine chain with 1-6 carbon atoms in the chain or straight or cyclic alkene, alkyne, hydroxyl, ketone, aldehyde, carbonate, carboxylic acid, or aryl and $R^1$ is hydrogen, C1-C6 alkyl chain or ring with N.

Specific examples of fluorine-containing thermal acid generators useful in embodiments of the present disclosure include tetrabutylammonium nonafluorobutanesulfonate which can be represented by the formula:

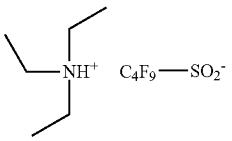

and thermal acid generators represented by the formula:

$$R—CF_2—SO_3^- \quad (R^1)_4N^+$$

where $R^1$ is hydrogen, C1-C6 alkyl chain or ring with N. Other examples of thermal acid generators include ammonium triflate, ammonium perfluorobutanesulfonate (PFBuS), amonium Ad-TFBS [4-adamantanecarboxyl-1,1,2,2-tetrafluorobutane sulfonate], ammonium AdOH-TFBS [3-hydroxy-4-adamantanecarboxyl-1,1,2,2-tetrafluorobutane sulfonate], ammonium Ad-DFMS [Adamantanyl-methoxycarbonyl)-difluoromethanesulfonate], ammonium AdOH-DFMS [3-Hydroxyadamantanyl-methoxycarbonyl)-difluoromethanesulfonate], ammonium DHC-TFBSS [4-dehydrocholate-1,1,2,2-tetrafluorobutanesulfonate] and ammonium ODOT-DFMS [Hexahydro-4,7-Epoxyisobenzofuran-1(3H)-one, 6-(2,2'-difluoro-2-sulfonatoacetic acid ester).

The above description of the photo acid generator and the thermal acid generator contemplates that the photo acid generator or the thermal acid generator are a component of a mixture including the material (e.g., polymer, monomer, crosslinking agent and/or catalyst) of the underlayer 204 and the photo acid generator or the thermal acid generator. In accordance with other embodiments of the present disclosure, the functional groups of the photo acid generator which generate acid in response to exposure to electromagnetic radiation or the functional groups of the thermal acid generator which generate acid in response to exposure to thermal energy can be incorporated into the polymer or monomer of the underlayer 204.

In accordance with embodiments of the present disclosure, the amount of photo acid generator or thermal acid generator present in the underlayer 204 is an amount that is sufficient to ensure an acid concentration in the underlayer 204 between an amount of 0.01 to 1 wt percent after the photo acid generator has been activated by light energy or the thermal acid generator has been activated by thermal energy. Embodiments in accordance with the present disclosure are not limited to these amounts of photo acid generator or thermal acid generator. For example lesser or greater amounts of these acid generators may be used. When the acid generator produces an amount of acid that results in less than 0.01 weight percent acid being present in the bottom layer, benefits of embodiments of the present disclosure may be reduced. When the acid generator produces an amount of acid that results in more than 1.0 percent acid being present in the bottom layer 204, premature chemical alteration of the photoresist layer that will be applied over bottom layer 204 may occur. Premature chemical alteration of the photoresist layer can render the photoresist layer less susceptible to accurate patterning.

Referring to operation 106 of FIG. 1A, operation 124 in FIG. 1B and to FIGS. 8 and 9, in accordance with embodiments of the present disclosure, after forming the underlayer 204 in operation 104, a portion of the photo acid generator (operation 106) or thermal acid generator (operation 124) migrates to an upper surface 205 of underlayer 204. The presence of fluorine or other low attraction elements or groups in the photo acid generator or thermal acid generator promotes the migration or floating of the photo acid generator or thermal acid generator to an upper surface of underlayer 204.

At operation 108 of FIG. 1A and operation 126 of FIG. 1B, crosslinking of the polymer of bottom layer 204, e.g., a BARC polymer, with the crosslinking agents in bottom layer 204, is promoted by baking the bottom layer at a temperature between about 90° C. to 400° C. See FIGS. 8 and 9. In some embodiments, baking of the bottom layer 204 is carried out for 30 seconds to 240 seconds. Embodiments in accordance with the present disclosure are not limited to baking the bottom layer within the foregoing temperature range or for the foregoing time. For example, temperatures above or below the range described above can be utilized to promote crosslinking of the bottom layer polymer with the crosslinking agents in bottom layer 204. In addition, baking of the bottom layer can be carried out for time periods above or below the range described above in order to promote crosslinking of the bottom layer using the crosslinking agents in bottom layer 204. In accordance with embodiments of the present disclosure, migration of a portion of the photo acid generator or thermal acid generator can also occur during operation 108 or after operation 108. In accordance with some embodiments of the present disclosure, the baking temperature profile, including temperature and a length of time can be adjusted to affect the migration of the photo acid generator through the underlayer. For example, by altering the baking temperature, the migration of the photo acid generator through the underlayer can be increased or decreased.

In accordance with another embodiment of the present disclosure, the crosslinking of the polymer of the bottom layer with the crosslinking agents in bottom layer 204 is promoted by a multistep baking process. An example of a multistep baking process includes baking the bottom layer in a first baking step at a temperature ranging between 90° C. to 180° C. for a period of time ranging between about 30 seconds to 180 seconds and then baking the bottom layer in a second baking step at a temperature ranging between 180° C. to 400° C. for a time period of 30 seconds to 180 seconds. Embodiments in accordance with the present disclosure are not limited to a multistep baking process as described above. For example, the temperature and time period of the first baking step may fall outside those described above. Further, the temperature and time period of the second baking step may fall outside the ranges described above.

In accordance with an embodiment of the present disclosure where a thermal baking is employed to promote the crosslinking of the polymer of bottom layer 204 and the crosslinking agents of the bottom layer 204, the weight ratio of the polymer of the bottom layer 204 and the amount of crosslinking agent ranges between 4:1 to 1:4. When the weight ratio of the polymer of the bottom layer 204 and the amount of crosslinking agent is greater than about 4:1, an excess of crosslinking of the polymer of the bottom layer may occur. When the weight ratio of the polymer of the bottom layer 204 and the amount of crosslinking agent is less than about 1:4, insufficient crosslinking of the polymer of the bottom layer may occur.

The following description now proceeds with reference to FIG. 1A, FIGS. 2-7 and only FIG. 9 and an embodiment where the underlayer includes a photo acid generator (PAG). FIG. 9 illustrates a method in accordance with embodiments of the present disclosure where the bottom layer 204 includes a photo acid generator. In contrast, FIG. 8 illustrates a method in accordance with embodiments of the present disclosure where the bottom layer 204 includes a thermal acid generator. Embodiments in accordance with FIG. 8 will be described below separately.

In accordance with other embodiments of FIG. 9, crosslinking of the polymer of the base layer 204 with the crosslinking agent can be promoted by exposing the bottom layer 204 to electromagnetic energy, e.g., light. An example of light useful to promote such crosslinking includes light having a wavelength in the range of 10 nm to 1000 nm. The exposure to light is carried out for a period of time sufficient to achieve the desired level of crosslinking. For example, the light exposure can be carried out for a period of time ranging from about 1 to 600 seconds when the light source has an intensity ranging between 1 to 500 millijoules. The light used for such exposure may be light of a single wavelength, light having several wavelengths or a broadband light. In accordance with these embodiments, the weight ratio of the polymer of the bottom layer 204 and amount of crosslinking agent ranges from 4:1 to 1:4.

When light energy is utilized to promote crosslinking between crosslinking agents and the polymer of bottom layer 204, the light exposure can be accomplished utilizing multiple light exposure steps. For example, in an embodiment, a first light exposure occurs after the formation of bottom layer 204 and before formation of the photoresist layer 214 (or the hard mask layer) in FIG. 8 and a second light exposure occurs after patterning of the bottom layer 204 prior to etching of the metal layer 203 or substrate 202. Embodiments in accordance with the present disclosure are not limited to such multistep light exposure processes. For example, some embodiments in accordance with the present disclosure utilize only one of the light exposure steps described above. When multiple steps of light exposure are utilized, the wavelength of light utilized for each step may be the same or they may differ. In addition, the length of time of each of the individual exposure steps can be the same or they may be different. For example, when a two-step exposure process is utilized, the light exposure of the first light exposure step and the light exposure of the second step may be carried out for a period of time of about 1 to about 600 seconds when the light source has an intensity between about 1 to 500 mJ. In accordance with embodiments of the present disclosure, exposure of the bottom layer 204 to electromagnetic energy for purposes of crosslinking the polymers of the bottom layer 204 does not result in the generation of acid by the photo acid generator.

Figure 3:
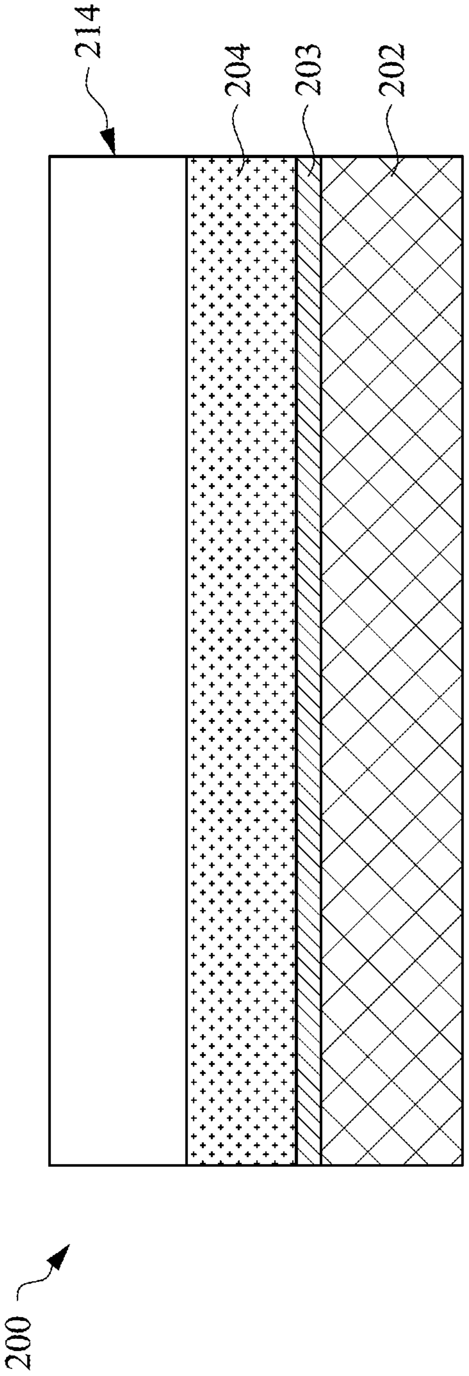

Referring to block 110 in FIG. 1A, FIG. 3 and FIG. 9, a photoresist (PR) layer 214 is formed over the bottom layer 204. The photoresist layer 214 may include any lithographically sensitive resist material, and in many embodiments, the photoresist layer 214 includes a photoresist material sensitive to a radiation source (e.g., UV light, deep ultraviolet (DUV) radiation, and/or EUV radiation). However, the principles of the present disclosure apply equally to e-beam resists and other direct-write resist materials. The photoresist layer 214 may be a positive-tone or negative-tone resist material and may have a multi-layer structure. Furthermore, the photoresist layer 214 may be implemented with a chemical amplification (CA) resist material. In one embodiment, a positive-tone CA resist material includes a polymeric material (not depicted) that becomes soluble in a developer after the polymer is exposed to acidic moieties. Alternatively, a negative-tone CA resist material includes a polymeric material (not depicted) that becomes insoluble in a developer after the polymer is exposed to acidic moieties.

In an embodiment the photoresist layer 214 includes a photoresist polymer resin along with one or more photoactive components (PAC), such as a photo acid generator, a photo base generator or a photo free radical generator in a photoresist solvent. In an embodiment the photoresist polymer resin may comprise a hydrocarbon structure (such as an alicyclic hydrocarbon structure) that contains one or more groups that will decompose (e.g., an acid labile group) or otherwise react when mixed with acids, bases, or free radicals. In an embodiment the hydrocarbon structure comprises a repeating unit that forms a skeletal backbone of the photoresist polymer resin. This repeating unit may include acrylic esters, methacrylic esters, crotonic esters, vinyl esters, maleic diesters, fumaric diesters, itaconic diesters, (meth)acrylonitrile, (meth)acrylamides, styrenes, vinyl ethers, combinations of these, or the like.

Specific structures which may be utilized for the repeating unit of the hydrocarbon structure include methyl acrylate, ethyl acrylate, n-propyl acrylate, isopropyl acrylate, n-butyl acrylate, isobutyl acrylate, tert-butyl acrylate, n-hexyl acrylate, 2-ethylhexyl acrylate, acetoxyethyl acrylate, phenyl acrylate, 2-hydroxyethyl acrylate, 2-methoxyethyl acrylate, 2-ethoxyethyl acrylate, 2-(2-methoxyethoxy)ethyl acrylate, cyclohexyl acrylate, benzyl acrylate, 2-alkyl-2-adamantyl (meth)acrylate or dialkyl(1-adamantyl)methyl (meth)acrylate, methyl methacrylate, ethyl methacrylate, n-propyl methacrylate, isopropyl methacrylate, n-butyl methacrylate, isobutyl methacrylate, tert-butyl methacrylate, n-hexyl methacrylate, 2-ethylhexyl methacrylate, acetoxyethyl methacrylate, phenyl methacrylate, 2-hydroxyethyl methacrylate, 2-methoxyethyl methacrylate, 2-ethoxyethyl methacrylate, 2-(2-methoxyethoxy)ethyl methacrylate, cyclohexyl methacrylate, benzyl methacrylate, 3-chloro-2-hydroxypropyl methacrylate, 3-acetoxy-2-hydroxypropyl methacrylate, 3-chloroacetoxy-2-hydroxypropyl methacrylate, butyl crotonate, hexyl crotonate and the like. Examples of the vinyl esters include vinyl acetate, vinyl propionate, vinyl butylate, vinyl methoxyacetate, vinyl benzoate, dimethyl maleate, diethyl maleate, dibutyl maleate, dimethyl fumarate, diethyl fumarate, dibutyl fumarate, dimethyl itaconate, diethyl itaconate, dibutyl itaconate, acrylamide, methyl acrylamide, ethyl acrylamide, propyl acrylamide, n-butyl acrylamide, tert-butyl acrylamide, cyclohexyl acrylamide, 2-methoxyethyl acrylamide, dimethyl acrylamide, diethyl acrylamide, phenyl acrylamide, benzyl acrylamide, methacrylamide, methyl methacrylamide, ethyl methacrylamide, propyl methacrylamide, n-butyl methacrylamide, tert-butyl methacrylamide, cyclohexyl methacrylamide, 2-methoxyethyl methacrylamide, dimethyl methacrylamide, diethyl methacrylamide, phenyl methacrylamide, benzyl methacrylamide, methyl vinyl ether, butyl vinyl ether, hexyl vinyl ether, methoxyethyl vinyl ether, dimethylaminoethyl vinyl ether and the like. Examples of the styrenes include styrene, methyl styrene, dimethyl styrene, trimethyl styrene, ethyl styrene, isopropyl styrene, butyl styrene, methoxy styrene, butoxy styrene, acetoxy styrene, chloro styrene, dichloro styrene, bromo styrene, vinyl methyl benzoate, .alpha.-methyl styrene, maleimide, vinylpyridine, vinylpyrrolidone, vinylcarbazole, combinations of these, or the like.

In an embodiment the repeating unit of the hydrocarbon structure may also have either a monocyclic or a polycyclic hydrocarbon structure substituted into it, or else the monocyclic or polycyclic hydrocarbon structure may be the repeating unit, in order to form an alicyclic hydrocarbon structure. Specific examples of monocyclic structures that may be used include bicycloalkane, tricycloalkane, tetracycloalkane, cyclopentane, cyclohexane, or the like. Specific examples of polycyclic structures that may be used include adamantine, norbornane, isobornane, tricyclodecane, tetracyclododecane, or the like.

The group which will decompose, otherwise known as a leaving group or an acid labile group, is attached to the hydrocarbon structure so that it will react with the acids/bases/free radicals to alter the chemical properties of the photoresist. In an embodiment the group which will decompose may be a carboxylic acid group, a fluorinated alcohol group, a phenolic alcohol group, a sulfonic group, a sulfonamide group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsylfonyl)methylene group, a bis(alkylsulfonyl)imido group, a tris(alkylcarbonyl methylene group, a tris(alkylsulfonyl)methylene group, combinations of these, or the like. Specific groups that may be utilized for the fluorinated alcohol group include fluorinated hydroxyalkyl groups, such as a hexafluoroisopropanol group. Specific groups that may be utilized for the carboxylic acid group include acrylic acid groups, methacrylic acid groups, or the like.

In accordance with embodiments of the present disclosure, the photoresist layer includes an amount of photo active components (PAC), such as a photo acid generator, capable of generating an amount of acid when exposed to electromagnetic energy, such as EUV radiation. In accordance with embodiments of the present disclosure, the amount of photo acid generator present in the photoresist is an amount that will generate less acid than the amount of acid that will diffuse into the photoresist from the underlayer as described below in more detail. In other words, the amount of acid from the underlayer that diffuses into the photoresist layer is greater than the amount of acid that is generated from acid generators present in the photoresist layer. When the amount of photo acid generator in the photoresist is within the amounts described above and the photoresist has been exposed to a pattern of light energy and acid formed in the underlayer 204 has diffused into the bottom of photoresist layer 214, the concentration of acid near the bottom of the photoresist layer 214 will be greater than the concentration of the acid in upper portions of photoresist layer 214. Without intending to be bound by theory, the higher concentration of acid in the lower portions of photoresist layer 214 will render the lower portions of photoresist more sensitive to the developer, e.g., more soluble in the developer, and thereby reduce the amount of photoresist residue or scum that remains after development.

Figure 4:
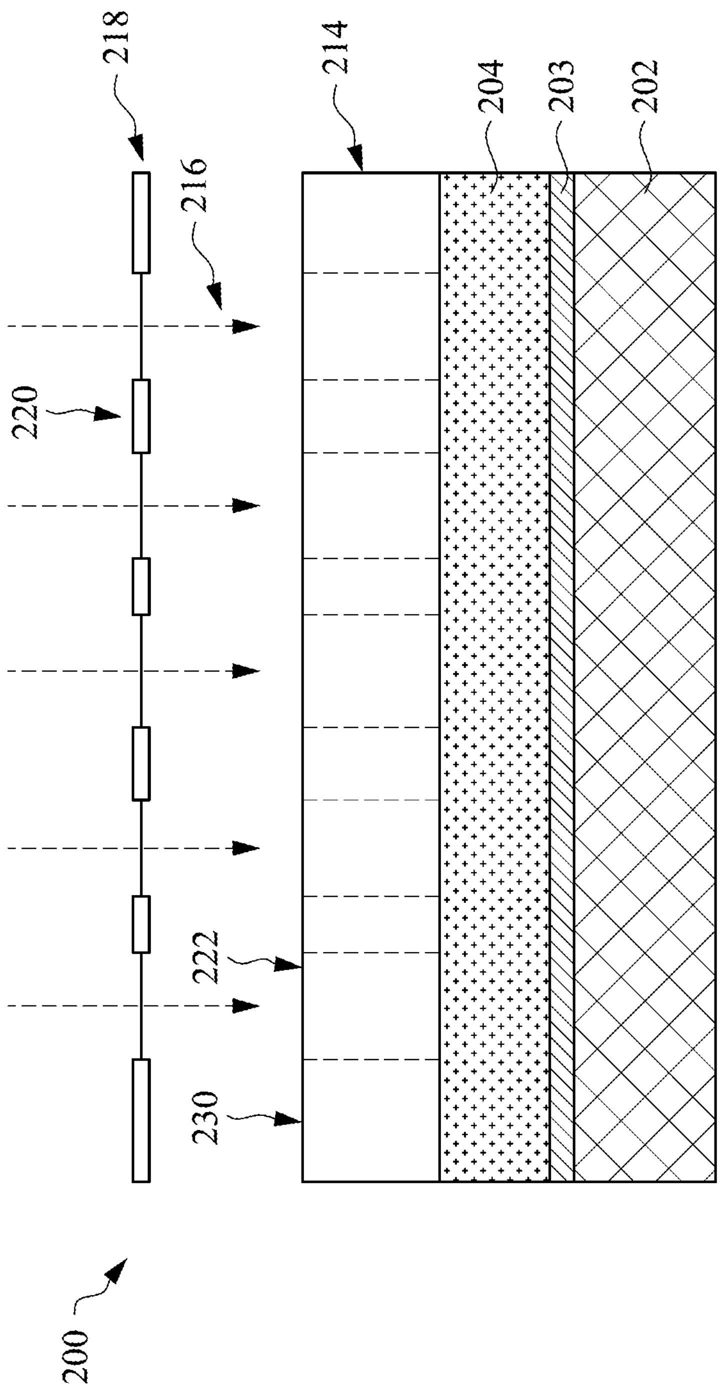

Referring to block 112 of FIG. 1A, FIG. 4 and FIG. 9, the photoresist layer 214 and underlayer 204 are blanket exposed to a radiation source generating radiation 216, in some embodiments prior to a pre-exposure baking process being applied to the photoresist layer 214. In other embodiments, the blanket exposure is carried out after a pre-exposure baking process is applied to the photoresist layer 214. In some embodiments, the radiation source producing radiation having a wavelength of approximately 365 nm, a DUV radiation such as KrF excimer laser (wavelength approximately 248 nm) or ArF excimer laser (wavelength approximately 193 nm), an EUV radiation (wavelength between about 1 nm and about 100 nm), an x-ray, an e-beam, an ion beam, and/or other suitable radiations. The exposure process at block 112 may be performed in air, in a liquid (immersion lithography), or in vacuum (e.g., for EUV lithography and e-beam lithography). In an exemplary embodiment, the exposure process at block 112 is carried out using an intensity of radiation and a time of exposure that is sufficient to cause the photo acid generator in underlayer 204 to generate acid while insufficient to activate photo acid generators present in the photoresist layer which would result in chemical alteration of the photoresist to the extent that solubility of the photoresist in a developer solution is altered to an undesirable degree. In some embodiments, the photoresist layer 214 and underlayer 204 are exposed to between 18 to 80 mJ of EUV energy. Embodiments in accordance with the present disclosure are not limited to exposing the photoresist layer 214 and underlayer 204 to this amount of EUV energy in operation 112; however, when photoresist layer 214 and underlayer 204 are exposed to EUV energy less than 18 mJ, a lower amount of acid will be generated by the photo acid generator. When photoresist layer 214 and underlayer 204 are exposed to EUV energy greater than 80 mJ, photo acid generators that are present in photoresist layer 214 may be activated and produce amounts of acid that chemically alters the photoresist layer 214 and its solubility in a developer to a greater degree than desired.

In other embodiments, the photoresist layer 214 and underlayer 204 are exposed to an amount of EUV radiation that does cause photo acid generators in photoresist layer 214 to produce acid, e.g., greater than 80 mJ of EUV radiation; however, as described above, in these embodiments, the amount of photo acid generators present in the photoresist layer 214 is such that the amount of acid generated from the photo acid generators is insufficient to chemically alter the photoresist to a degree where the solubility of the photoresist in a developer is altered.

As a result of radiation exposure step 112, acid (H+) is generated by the photo acid generators present in underlayer 204. In accordance with some embodiments, the concentration of acid formed by the photo acid generator in underlayer 204 will be greater in portions of underlayer 204 where the photo acid generator has migrated in operation 106. For example, in embodiments where the photo acid generator migrates towards upper surface 205 of underlayer 204, the concentration of acid near upper surface 205 of underlayer 204 will be greater than in other portions of underlayer 204.

Referring to operation 113, a portion of the acid generated from the photo acid generator in underlayer 204 in operation 112 diffuses from the underlayer 204 into lower portions of photoresist layer 214. The acid which diffuses into lower portions of photoresist layer 214 is available to interact with the polymers of photoresist layer 214 to chemically alter the photoresist in a way that alters the solubility of the photoresist in a developer solution. The diffusion of acid from underlayer 204 into photoresist layer 214 will increase the concentration of acid in lower portions of photoresist layer 214 where incomplete development of photoresist layer 214 can result in photoresist residue or scum remaining. In addition, diffusion of acid from underlayer 204 into photoresist layer 214 can improve the distribution uniformity of acid in lower portions of the photoresist layer 214 which can also reduce the likelihood that lower portions of the photoresist layer 214 will be underdeveloped and result in photoresist residue or scum remaining after the developing process is completed. In accordance with some embodiments of the present disclosure, the temperature profile, including temperature and a length of time, at which the diffusion of acid is carried out can be adjusted to affect the amount of acid that diffuses from the underlayer 204 into photoresist layer 214. For example, by altering the temperature of the underlayer and photoresist layer when the acid is diffusing from underlayer 204 into photoresist layer 214, the amount of acid that diffuses into the photoresist layer 214 can be increased or decreased. For example, increasing the temperature of the underlayer 204 and the photoresist layer 214 when the acid is diffusing from underlayer 204 into photoresist layer 214 increases the amount of acid that diffuses into photoresist layer 214. In contrast, decreasing the temperature of the underlayer 204 and the photoresist layer 214 when the acid is diffusing from underlayer 204 into photoresist layer 214 decreases the amount of acid that diffuses into the photoresist layer 214.

Referring to block 114 of FIG. 1A and to FIG. 4, a photolithography technique using a photomask 220 that includes a pattern 218 is applied to photoresist layer 214. The photomask 220 may be a transmissive mask or a reflective mask, the latter of which may further implement resolution enhancement techniques such as phase-shifting, off-axis illumination (OAI) and/or optical proximity correction (OPC). The photomask causes portions 222 of the photoresist layer 214 to be exposed to the radiation 216, e.g., EUV radiation having a wavelength of 13 nm and some portions 230 to not be exposed to the radiation 216. At operation 116 in FIG. 1A, the exposed regions 222 of the photoresist layer 214 undergo chemical changes, including interacting with acid (H+) formed by photo acid generators in photoresist layer 214 and acid that has diffused into photoresist layer 214 from underlayer 204. The unexposed regions 230 remain substantially unchanged in chemical properties. These chemical changes affect the solubility in a developer solution as described below.

Figure 5:
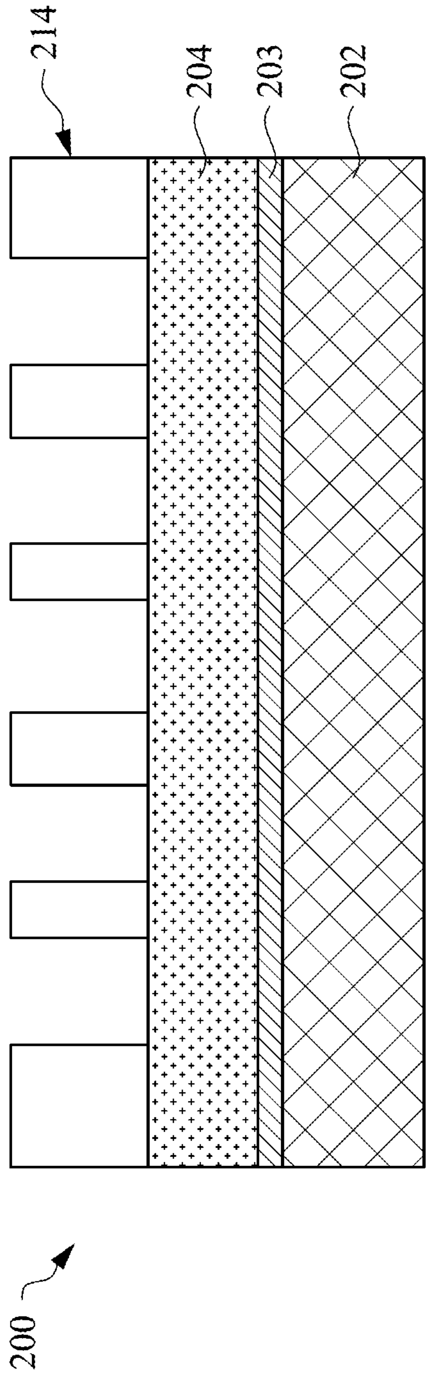

Referring to FIG. 5, a developing process is performed on the workpiece 200. The developing process dissolves or otherwise removes either the exposed regions 222 in the case of a positive-tone resist development process or the unexposed regions 230 in the case of a negative-tone resist development process. The developing process may begin with a post-exposure baking process. Following the optional post-exposure baking process, a developer is applied to the workpiece 200, thereby removing the particular regions (the exposed regions 222 or the unexposed regions 230) of the photoresist layer 214. With embodiments of the present disclosure, the increased concentration of acid in lower portions of photoresist layer 214 renders the exposed portions of photoresist layer 214, especially the lower portions, such as bottom of the trenches more soluble in a developer. This increased solubility of the photoresist in a developer at the bottom of trenches decreases the amount of photoresist residue or scum that remains in the bottom of the trenches after the developing process. Suitable positive-tone developers include tetramethyl ammonium hydroxide (TMAH), KOH, NaOH, and/or other suitable solvents, and suitable negative-tone developers include solvents such as n-butyl acetate, ethanol, hexane, benzene, toluene, and/or other suitable solvents. In the depicted embodiment, the developer is a positive-tone, basic solvent such as TMAH. In many embodiments, a post-exposure bake is performed on the workpiece 200 subsequent to the developing process to further stabilize the pattern of the photoresist layer 214.

Figure 6:
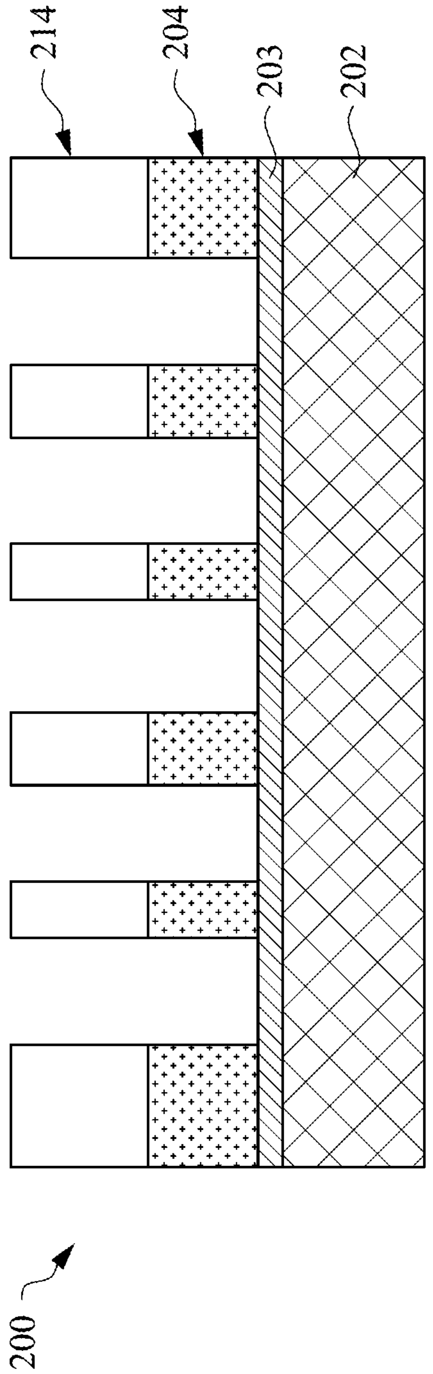

Referring to FIG. 6, portions of the bottom layer 204 (e.g., the BARC layer) are selectively removed in an etching process using the patterned photoresist layer 214 as an etch mask. The etching/patterning process demonstrates etching selectivity for the bottom layer 204 over the underlying substrate 202 and/or the conductive layer 203 on the substrate. In an embodiment illustrated in FIG. 7, the patterned photoresist layer 214 is removed from the workpiece 200 by any suitable method prior to etching of the substrate 202 or conductive layer 203 on substrate 202. In other embodiments, the patterned photoresist layer 214 is not removed before etching of the substrate 202 or conductive layer 203 on substrate 202.

Figure 7:
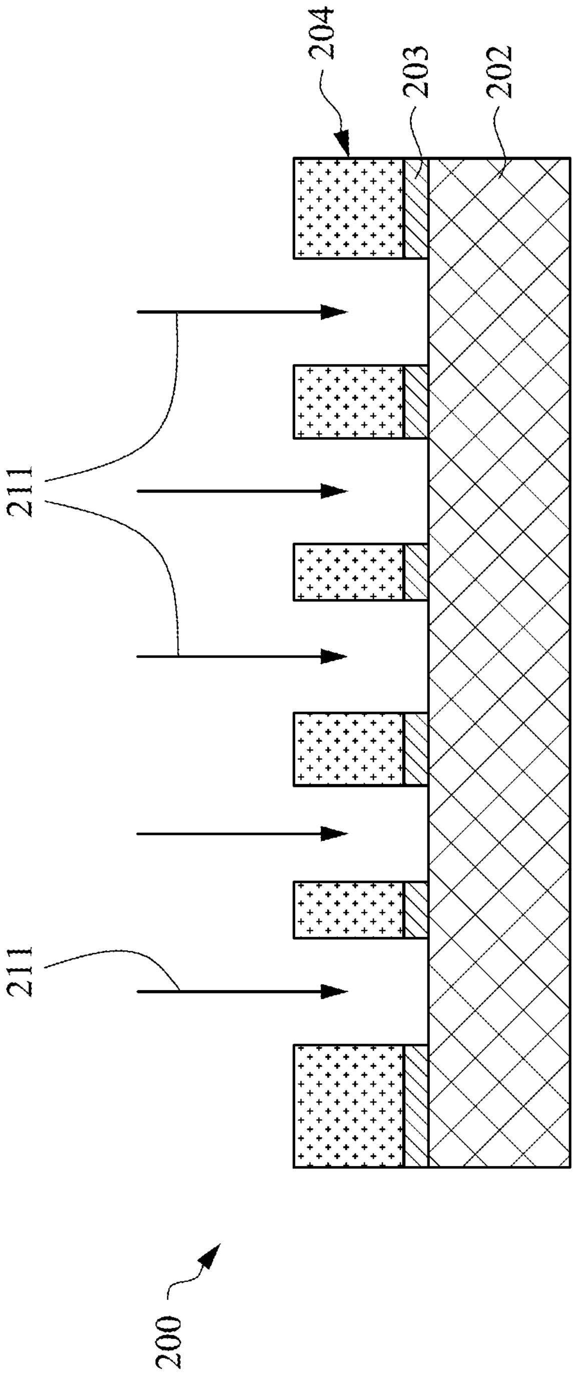

Referring to FIG. 7, the substrate 202 including metal layer 203 is processed using the patterned bottom layer 204 as a mask and an etchant 211. As noted above, if patterned photoresist layer 214 is not removed, etching of substrate 202, including metal layer 203, occurs through patterned photoresist layer 214 and patterned bottom layer 204. Metal layer 203 can include metals such as TiAlC, TiAl, TaAlC, TaAl, tungsten, cobalt, ruthenium, iridium, molybdenum, copper, aluminum, or combinations thereof. In the exemplary embodiment illustrated in FIG. 7, a portion of the metal layer 203 has been removed by etching using the patterned bottom layer 204 as an etch mask. In some embodiments, the metal layer 203 is etched using any suitable wet etching chemical and process. For example, in some embodiments, the metal layer is wet etched using an acidic or alkaline solution. The wet etching solution may contain an oxidant or it may not contain an oxidant. Examples of such wet etching solutions include those known as SC-1, SC-2, hydrogen peroxide, hydrochloric acid, ammonia and the like. Embodiments of the present disclosure are not limited to wet etching metal layer 203, for example, metal layer 203 can be etched using a dry etching process, an RIE process or other suitable etching process or combinations thereof.

It is understood that the concepts of the present disclosure apply to any fabrication process performed on the substrate 202. In various examples, the processed substrate 202 is used to fabricate a gate stack, to fabricate an interconnect structure, to form non-planar devices by etching to expose a fin or by epitaxially growing fin material, and/or other suitable applications. The bottom layer 204 is subsequently removed using any suitable method after the substrate 202 is processed.

The workpiece 200 may then be provided for additional fabrication processes. For example, the workpiece 200 may be used to fabricate an integrated circuit chip, a system-on-a-chip (SOC), and/or a portion thereof, and thus the subsequent fabrication processes may form various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, other types of transistors, and/or other circuit elements.

FIG. 1B is a flowchart of another embodiment of a method 118 in accordance with the present disclosure. The method 100 illustrated in FIG. 1A utilized a photo acid generator in the underlayer 204. The method 118 of FIG. 1B differs from the method 100 of FIG. 1A in that it utilizes a thermal acid generator instead of a photo acid generator in underlayer 204. FIG. 8 depicts an embodiment of the present disclosure wherein the underlayer 204 includes a thermal acid generator. The description of steps 102, 104 and 106 with regard to FIG. 1A applies to steps 120, 122 and 124 of FIG. 1B, respectively, as pointed out below, with the exception that a thermal acid generator is present in underlayer 204 and not a photo acid generator.

Referring to block 120 of FIG. 1B and FIG. 2, a workpiece 200 including a substrate 202 is provided for patterning. The description above regarding FIG. 1A and step 102 providing a substrate is also applicable to step 120 and is not repeated here.

Referring to step 122 of FIG. 1B and FIG. 2, a bottom layer 204 containing a thermal acid generator is formed on substrate 202, e.g., over the substrate 202 or over the conductive layer 203 if one is present. The description above regarding FIG. 1A and step 104 of forming an organic underlayer over the substrate is also applicable to step 122 of FIGS. 1B and 1*s* not repeated here. Suitable thermal acid generators are described above.

Referring to operation 124 in FIG. 1B and to FIG. 8, in accordance with this embodiment of the present disclosure, after forming the underlayer 204 containing a thermal acid generator in operation 122, a portion of the thermal acid generator migrates to an upper surface 205 of underlayer 204. The presence of fluorine or other low attraction elements or groups in the thermal acid generator promotes the migration or floating of the thermal acid generator to an upper surface of underlayer 204.

At operation 126 of FIG. 1B, crosslinking of the polymer of bottom layer 204, e.g., a BARC polymer, with the crosslinking agents in bottom layer 204, is promoted by baking the bottom layer at a temperature between about 90° C. to 400° C. See FIG. 9. In some embodiments, baking of the bottom layer 204 is carried out for 30 seconds to 240 seconds. Embodiments in accordance with the present disclosure are not limited to baking the bottom layer within the foregoing temperature range or for the foregoing time. For example, temperatures above or below the range described above can be utilized to promote crosslinking of the bottom layer polymer with the crosslinking agents in bottom layer 204. In addition, baking of the bottom layer can be carried out for time periods above or below the range described above in order to promote crosslinking of the bottom layer using the crosslinking agents in bottom layer 204. In accordance with embodiments of the present disclosure, migration of a portion of the thermal acid generator can also occur during operation 126 or after operation 126.

In accordance with another embodiment of the present disclosure, the crosslinking of the polymer of the bottom layer containing a thermal acid generator with the crosslinking agents in bottom layer 204 is promoted by a multistep baking process. An example of a multistep baking process includes baking the bottom layer in a first baking step at a temperature ranging between 90° C. to 180° C. for a period of time ranging between about 30 seconds to 180 seconds and then baking the bottom layer in a second baking step at a temperature ranging between 180° C. to 400° C. for a time period of 30 seconds to 180 seconds. Embodiments in accordance with the present disclosure are not limited to a multistep baking process as described above. For example, the temperature and time period of the first baking step may fall outside those described above. Further, the temperature and time period of the second baking step may fall outside the ranges described above.

During the crosslinking operation 126, the thermal energy used to promote the crosslinking of the underlayer 204 polymers causes the thermal acid generator to generate acid (H+) as shown in FIG. 8.

Referring to block 128 in FIG. 1B, FIG. 3 and FIG. 8, a photoresist (PR) layer 214 is formed over the bottom layer 204. The photoresist layer 214 may include any lithographically sensitive resist material, and in many embodiments, the photoresist layer 214 includes a photoresist material sensitive to a radiation source (e.g., UV light, deep ultraviolet (DUV) radiation, and/or EUV radiation). However, the principles of the present disclosure apply equally to e-beam resists and other direct-write resist materials. The photoresist layer 214 may be a positive-tone or negative-tone resist material and may have a multi-layer structure. Furthermore, the photoresist layer 214 may be implemented with a chemical amplification (CA) resist material. In one embodiment, a positive-tone CA resist material includes a polymeric material (not depicted) that becomes soluble in a developer after the polymer is exposed to acidic moieties. Alternatively, a negative-tone CA resist material includes a polymeric material (not depicted) that becomes insoluble in a developer after the polymer is exposed to acidic moieties. Further details of suitable photoresists are described above. At block 130 of FIG. 1B, solvent from photoresist layer 214 is driven off by applying a pre-exposure bake to the photoresist layer 214 on the underlayer 204. This pre-exposure bake is carried out at a temperature that does not damage or decompose the deposited photoresist or the cross-linked underlayer. Temperatures in the range of 90° C. to 150° C. are suitable for this pre-exposure bake.

Referring to operation 132 in FIG. 1B, FIG. 3 and FIG. 8, a portion of the acid generated from the thermal acid generator in underlayer 204 in operation 126 diffuses from the underlayer 204 into lower portions of photoresist layer 214. The acid which diffuses into lower portions of photoresist layer 214 is available to interact with the polymers of photoresist layer 214 to chemically alter the photoresist in a way that alters the solubility of the photoresist in a developer solution. The diffusion of acid from underlayer 204 into photoresist layer 214 will increase the concentration of acid in lower portions of photoresist layer 214 where incomplete development of photoresist layer 214 can result in photoresist residue or scum remaining. In addition, diffusion of acid from underlayer 204 into photoresist layer 214 can improve the distribution uniformity of acid in lower portions of the photoresist layer 214 which can also reduce the likelihood that lower portions of the photoresist layer 204 will be underdeveloped and result in photoresist residue or scum remaining after the developing process is completed. In accordance with some embodiments of the present disclosure, the temperature profile, including temperature and a length of time, at which the diffusion of acid is carried out can be adjusted to affect the amount of acid that diffuses from the underlayer 204 into photoresist layer 214. For example, by altering the temperature of the underlayer and photoresist when the acid is diffusing from underlayer 204 into photoresist layer 214, the amount of acid that diffuses into the photoresist layer 214 can be increased or decreased. For example, increasing the temperature of the underlayer 204 and the photoresist layer 214 when the acid is diffusing from underlayer 204 into photoresist layer 214 increases the amount of acid that diffuses into photoresist layer 214. In contrast, decreasing the temperature of the underlayer 204 and the photoresist layer 214 when the acid is diffusing from underlayer 204 into photoresist layer 214 decreases the amount of acid that diffuses into the photoresist layer 214.

Referring to block 134 of FIG. 1B and to FIG. 4, a photolithography technique using a photomask 220 that includes a pattern 218 is applied to photoresist layer 214. The photomask 220 may be a transmissive mask or a reflective mask, the latter of which may further implement resolution enhancement techniques such as phase-shifting, off-axis illumination (OAI) and/or optical proximity correction (OPC). The photomask causes portions 222 of the photoresist layer 214 to be exposed to the radiation 216, e.g., EUV radiation having a wavelength of 13 nm and some portions 230 to not be exposed to the radiation 216. At operation 132 in FIG. 1B, the exposed regions 222 of the photoresist layer 214 undergo chemical changes, including interacting with acid (H+) formed by photo acid generators in photoresist layer 214 and acid from the thermal acid generators in underlayer 204 that has diffused into photoresist layer 214. The unexposed regions 230 remain substantially unchanged in chemical properties. These chemical changes affect the solubility in a developer solution as described below.

In accordance with the embodiment of FIG. 1B, referring to FIG. 5, a developing process is performed on the workpiece 200. The developing process dissolves or otherwise removes either the exposed regions 222 in the case of a positive-tone resist development process or the unexposed regions 230 in the case of a negative-tone resist development process. The developing process may begin with a post-exposure baking process. Following the optional post-exposure baking process, a developer is applied to the workpiece 200, thereby removing the particular regions (the exposed regions 222 or the unexposed regions 230) of the photoresist layer 214. With embodiments of the present disclosure, the increased concentration of acid (resulting from the diffusion of acid from underlayer 204) into lower portions of photoresist layer 214 renders the exposed portions of photoresist layer 214, especially the lower exposed portions, such as bottom of the trenches, more soluble in a developer. This increased solubility of the photoresist in a developer at the bottom of trenches decreases the amount of photoresist residue or scum that remains in the bottom of the trenches after the developing process. Suitable positive-tone developers include tetramethyl ammonium hydroxide (TMAH), KOH, NaOH, and/or other suitable solvents, and suitable negative-tone developers include solvents such as n-butyl acetate, ethanol, hexane, benzene, toluene, and/or other suitable solvents. In the depicted embodiment, the developer is a positive-tone, basic solvent such as TMAH. In many embodiments, a post-exposure bake is performed on the workpiece 200 subsequent to the developing process to further stabilize the pattern of the photoresist layer 214.

In accordance with embodiments of FIG. 1B, referring to FIG. 6, portions of the bottom layer 204 (e.g., the BARC layer) are selectively removed in an etching process using the patterned photoresist layer 214 as an etch mask. The etching/patterning process demonstrates etching selectivity for the bottom layer 204 over the underlying substrate 202 and/or the conductive layer 203 on the substrate. In an embodiment illustrated in FIG. 7, the patterned photoresist layer 214 is removed from the workpiece 200 by any suitable method prior to etching of the substrate 202 or conductive layer 203 on substrate 202. In other embodiments, the patterned photoresist layer 214 is not removed before etching of the substrate 202 or conductive layer 203 on substrate 202.

In accordance with embodiments of FIG. 1B, referring to FIG. 7, the substrate 202 including metal layer 203 is processed using the patterned bottom layer 204 as a mask and an etchant 211. As noted above, if patterned photoresist layer 214 is not removed, etching of substrate 202, including metal layer 203, occurs through patterned photoresist layer 214 and patterned bottom layer 204. Metal layer 203 can include metals such as TiAlC, TiAl, TaAlC, TaAl, tungsten, cobalt, ruthenium, iridium, molybdenum, copper, aluminum, or combinations thereof. In the exemplary embodiment illustrated in FIG. 7, a portion of the metal layer 203 has been removed by etching using the patterned bottom layer 204 as an etch mask. In some embodiments, the metal layer 203 is etched using any suitable wet etching chemical and process. For example, in some embodiments, the metal layer is wet etched using an acidic or alkaline solution. The wet etching solution may contain an oxidant or it may not contain an oxidant. Examples of such wet etching solutions include those known as SC-1, SC-2, hydrogen peroxide, hydrochloric acid, ammonia and the like. Embodiments of the present disclosure are not limited to wet etching metal layer 203, for example, metal layer 203 can be etched using a dry etching process, an RIE process or other suitable etching process or combinations thereof.

It is understood that the concepts of the present disclosure apply to any fabrication process performed on the substrate 202. In various examples, the processed substrate 202 is used to fabricate a gate stack, to fabricate an interconnect structure, to form non-planar devices by etching to expose a fin or by epitaxially growing fin material, and/or other suitable applications. The bottom layer 204 and optional hard mask layer are subsequently removed using any suitable method after the substrate 202 is processed.

The workpiece 200 may then be provided for additional fabrication processes. For example, the workpiece 200 may be used to fabricate an integrated circuit chip, a system-on-a-chip (SOC), and/or a portion thereof, and thus the subsequent fabrication processes may form various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, other types of transistors, and/or other circuit elements.

In accordance with embodiments of the present disclosure, including embodiments in accordance with FIGS. 1A and 1B, underlayer 204 and photoresist layer 214 may be applied by any suitable technique, and in an exemplary embodiment, are applied in a liquid form using a spin-on (i.e., spin coating) technique. A spin coating process may use centrifugal force to disperse the photoresist layer 214 in a liquid form across a surface of an underlying layer in a uniform thickness. To facilitate application, the underlayer 204 or photoresist layer 214 may include a solvent, which, when removed, leaves the layer in a solid or semisolid form (e.g., a film). The solvent may be one or more of the following: propylene glycol methyl ether acetate, propylene glycol monomethyl ether, gamma-butyrolactone, ethyl lactate, cyclohexanone, n-butylacetate, ethyl ketone, dimethyl formamide, alcohol (e.g., isopropyl alcohol or ethanol), or other suitable solvent. The solvent may be driven off as part of the spin coating, during a settling process, and/or during a post-application/pre-exposure baking process. The pre-exposure baking process may be implemented by any suitable equipment such as, for example, a hotplate, at any temperature suitable for the particular compositions of the layer and the solvent employed.

In accordance with at least one embodiment, a method includes providing a substrate and forming an underlayer over the substrate. The underlayer includes a crosslinkable polymer and a photo acid generator or a thermal acid generator. The underlayer is thermally treated to cross-link the cross-linkable polymer of the underlayer. A photoresist layer is then formed over the thermally treated underlayer. Acid generated from the photo acid generator or thermal acid generator diffuses from the underlayer into lower portions of the photoresist layer. The acid that diffuses from the underlayer into the photoresist layer alters a solubility of the photoresist layer in a developer through an interaction between the acid diffused into the photoresist layer from the underlayer and the cross-linkable polymer of the photoresist layer. The increased concentration of acid in the lower regions of the photoresist layer can increase the solubility of the photoresist layer in these lower regions. Increasing the solubility of the photoresist in these lower regions can reduce the amount of photoresist residue or scum that remains after the development process is complete.

In accordance with at least one embodiment, a method includes providing a substrate and forming a bottom layer over the substrate. As in the previous embodiment, the bottom layer includes a crosslinkable polymer and a first acid generator component. The first acid generator is allowed to migrate towards an upper surface of the bottom layer upon which a photoresist layer will be formed. The bottom layer is baked to crosslink the crosslinkable polymer of the bottom layer. The bottom layer generates acid from the first acid generator component in the bottom layer. A photoresist layer including a second acid generator compound is formed over the bottom layer. A first amount of acid (H+) generated from the first acid generator component in the bottom layer diffuses into a lower portion of the photoresist layer. A second amount of acid is generated from the second acid generator component in the photoresist layer by exposing the photoresist layer to a pattern of radiation 216 from a radiation source. In accordance with this embodiment, the first amount of acid that diffuses into the photoresist layer from the bottom layer is greater than the second amount of acid that is generated from the second acid generator component in the photoresist layer.

In accordance with at least one embodiment, a method includes providing a substrate and forming a BARC layer over the substrate. The BARC layer includes a crosslinkable polymer and a first photo acid generator component. The first photo acid generator component is migrated towards an upper surface of the BARC layer upon which a photoresist layer will subsequently be formed. The cross-linkable polymer of the BARC layer is cross-linked by exposing the crosslinkable polymer to thermal energy. The photoresist layer that is formed over the bottom layer includes a second acid generator component. Acid is generated from the first photo acid generator component in the BARC layer by exposing the first photo acid generator to EUV radiation. A first amount of acid generated from the first acid generator component in the BARC layer diffuses into a lower portion of the photoresist layer. A second amount of acid (H+) generated from the second acid generator component in the photoresist layer by exposing the photoresist layer to a pattern of radiation 216 from a radiation source. In accordance with this embodiment, the first amount of acid that diffuses into the lower portion of the photoresist layer from the BARC layer is greater than the second amount of acid generated from the second acid generator component in the photoresist layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

providing a substrate;

forming an underlayer over the substrate, wherein the underlayer includes a crosslinkable polymer and a thermal acid generator;

thermally treating the underlayer to crosslink the polymer of the underlayer by performing a multistep baking process, the multistep baking process comprising a first baking step at a temperature ranging between 90° C. to 180° C. for a first period of time and a second baking step at a temperature ranging between 180° C. to 400° C. for a second period of time, wherein the multistep baking process generates acid (H+) from the thermal acid generator;

forming a photoresist layer over the thermally treated underlayer, wherein the photoresist layer includes a crosslinkable polymer and a photo acid generator;

diffusing a first amount of acid generated from the thermal acid generator in the underlayer into the photoresist layer, wherein the first amount of acid is elected to alter a solubility of the photoresist layer in a developer;

exposing the altered photoresist layer to a pattern of radiation, wherein exposing the altered photoresist layer generates a second amount of acid from the photo acid generator in the photoresist layer, wherein the second amount of acid is not sufficient to chemically alter the photoresist to a degree where the solubility of the photoresist in a developer is altered; and developing the altered photoresist layer that has been exposed to the pattern of radiation.

2. The method of claim 1, wherein forming the underlayer includes forming a layer of a BARC or a SoC material.

3. The method of claim 1, wherein providing a substrate includes providing a substrate that is conductive.

4. The method of claim 1, further comprising migrating a portion of the thermal acid generator towards an upper surface of the underlayer.

5. A method, comprising:

providing a substrate;

forming a bottom layer over the substrate, wherein the bottom layer includes a crosslinkable polymer and a first acid generator component;

migrating a portion of the first acid generator component towards an upper surface of the bottom layer;

crosslinking the crosslinkable polymer of the bottom layer;

forming a photoresist layer over the bottom layer, the photoresist layer including a second acid generator component;

blanketly exposing the photoresist layer and the bottom layer to an extreme ultraviolent (EUV) radiation to concurrently generate a first amount of acid (H+) from the first acid generator component in the bottom layer and a second amount of acid (H+) from the second acid generator component in the photoresist layer, wherein the second amount of acid is not sufficient to chemically alter the photoresist to a degree where the solubility of the photoresist in a developer is altered;

baking the photoresist layer, wherein the baking causes diffusion of a portion of the first amount of acid into lower portions of the photoresist layer, wherein an amount of the first amount of acid diffused into the photoresist layer is greater than the second amount of acid;

exposing the photoresist layer to a pattern of the EUV radiation through a photomask to generate a third amount of acid in the exposed regions of the photoresist layer to alter the solubility of the exposed regions of the photoresist layer in the developer; and developing the photoresist layer.

6. The method of claim 5, wherein crosslinking the crosslinkable polymer of the bottom layer includes heating the bottom layer in an environment at a temperature between 90° C. and 400° C.

7. The method of claim 5, further comprising prior to exposing the photoresist layer to a pattern of radiation, driving solvent from the photoresist layer by baking the photoresist layer in an environment at a temperature between 90° C. and 150° C.

8. The method of claim 5, wherein generating the first amount of acid from the first acid generator component in the bottom layer and generating the second amount of acid from the second acid generator component in the photoresist layer include exposing the first and second acid generator components to greater than 80 mJ of EUV radiation.

9. A method, comprising:

providing a substrate;

forming a BARC layer over the substrate, wherein the BARC layer includes a crosslinkable polymer and a first photo acid generator component;

migrating a portion of the first photo acid generator component towards an upper surface of the BARC layer;

crosslinking the crosslinkable polymer of the BARC layer by exposing the crosslinkable polymer to thermal energy;

forming a photoresist layer over the BARC layer, the photoresist layer including a second photo acid generator component;

blanketly exposing the photoresist layer and the BARC layer to a first radiation to generate acid from the first photo acid generator component in the BARC layer, wherein the first radiation does not cause the second photo acid generator component in the photoresist layer to produce acid;

diffusing a first amount of acid (H+) generated from the first photo acid generator component in the BARC layer into a lower portion of the photoresist layer;

generating a second amount of acid (H+) from the second photo acid generator component in the photoresist layer by exposing the photoresist layer to a pattern of a second radiation from a radiation source, the first amount of acid being greater than the second amount of acid; and developing the photoresist layer.

10. The method of claim 9, wherein the first photo acid generator is a mirine-containing photo acid generator.

11. The method of claim 9, wherein the migrating a portion of the first photo acid generator towards an upper surface of the BARC layer occurs during the crosslinking of the crosslinkable polymer of the BARC layer.

12. The method of claim 9, wherein the first radiation is an EUV radiation with a first energy between 18 to 80 mJ, and the second radiation is an EUV radiation with a second energy greater than 80 mJ.

13. The method of claim 1, wherein the crosslinkable polymer has one of the following structures:

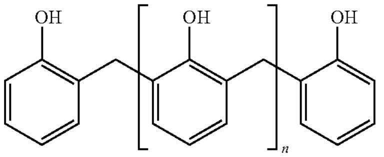

or

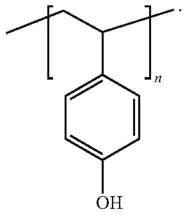

14. The method of claim 1, wherein the thermal acid generator component comprises tetrabutylammonium nonafluorobutanesulfonate, ammonium triflate, ammonium perfluorobutanesulfonate (PFBuS), amonium Ad-TFBS [4-adamantanecarboxyl-1,1,2,2-tetrafluorobutane sulfonate], ammonium AdOH-TFBS [3-hydroxy-4-adamantanecarboxyl-1,1,2,2-tetrafluorobutane sulfonate], ammonium Ad-DFMS [Adamantanyl-methoxycarbonyl)-difluoromethanesulfonate], ammonium AdOH-DFMS [3-Hydroxyadamantanyl-methoxycarbonyl)-difluoromethanesulfonate], ammonium DHC-TFBSS [4-dehydrocholate-1,1,2,2-tetrafluorobutanesulfonate] and ammonium ODOT-DFMS [hexahydro-4,7-epoxyisobenzofuran-1(3H)-one or 6-(2,2'-difluoro-2-sulfonatoacetic acid ester).

15. The method of claim 1, wherein the first period of time and the second period of time independently range from 30 seconds to 180 seconds.

16. The method of claim 5, wherein the first acid generator components comprise triphenylsulfonium perfluoro-1-butanesulfonate, (4-fluorophenyl)diphenylsulfonium triflate or tris-(4-tert-butylphenyl)sulfonium triflate.

17. The method of claim 5, further comprising controlling a temperature and a length of time to control the amount of the first amount of acid diffused into the photoresist layer.

18. The method of claim 5, further comprising performing a post-exposure baking after developing the photoresist layer.

19. The method of claim 5, further comprising selectively removing portions of the bottom layer in an etching process using a patterned photoresist layer formed by the developing the photoresist layer.

20. The method of claim 1, further comprising performing a pre-exposure baking to the photoresist layer at a temperature ranging from 90° C. to 150° C.

* * * * *